(12) United States Patent
Oosaki et al.

(10) Patent No.: US 7,408,154 B2
(45) Date of Patent: Aug. 5, 2008

(54) SCANNING ELECTRON MICROSCOPE, METHOD FOR MEASURING A DIMENSION OF A PATTERN USING THE SAME, AND APPARATUS FOR CORRECTING DIFFERENCE BETWEEN SCANNING ELECTRON MICROSCOPES

(75) Inventors: Mayuka Oosaki, Yokohama (JP); Chie Shishido, Yokohama (JP); Hiroki Kawada, Tsuchiura (JP); Tatsuya Maeda, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 130 days.

(21) Appl. No.: 11/260,187

(22) Filed: Oct. 28, 2005

(65) Prior Publication Data
US 2006/0091309 A1   May 4, 2006

(30) Foreign Application Priority Data
Oct. 29, 2004   (JP)   ............... 2004-314999

(51) Int. Cl.
G01N 23/00 (2006.01)
G21K 7/00 (2006.01)
(52) U.S. Cl. .................. 250/307; 250/306; 250/309; 250/310; 250/311; 250/399; 250/492.3
(58) Field of Classification Search ............ 250/307
See application file for complete search history.

(56) References Cited
U.S. PATENT DOCUMENTS
3,780,853 A * 12/1973 Kuhn ..................... 199/63
4,682,301 A * 7/1987 Horiba et al. ........... 708/308

5,323,003 A * 6/1994 Shido et al. ............. 250/306
5,646,403 A * 7/1997 Mori et al. .............. 250/310

(Continued)

OTHER PUBLICATIONS

"Spatial Filters—Gaussian Smoothing", http://homepages.inf.ed.ac.uk/rbf/HIPR2/gsmooth.htm.*

(Continued)

Primary Examiner—David A. Vanore
Assistant Examiner—Bernard Souw
(74) Attorney, Agent, or Firm—Antonelli, Terry, Stout & Kraus, LLP.

(57) ABSTRACT

As measurement accuracy required for the scanning electron microscope (SEM) for measuring a pattern width becomes stringent, a technique of reducing the difference in a measured dimension between the SEM's is desired. However, the conventional technique of evaluating the difference in a measured dimension between the SEM's cannot separate the difference in a measured dimension between the SEM's themselves and a dimensional change resulting from deformation of the pattern itself. Moreover, the technique of reducing the difference in a measured dimension between the SEM's needs an operator for reducing the difference in a measured dimension between the SEM's for each measurement pattern shape. In this invention, a pattern at the same position is measured for a plurality of times with each SEM, and a different between extrapolated values of measured values obtained by the respective SEM's is calculated, whereby separation between the difference in a measured dimension between the SEM's and a dimensional change resulting from deformation of the pattern itself is made possible. Moreover, matching electron beam image profiles between the SEM's using an operator that simulates a difference in beam diameter between the SEM's makes it possible to reduce the difference in a measured dimension between the SEM's, not depending on a dimensional measurement pattern shape.

13 Claims, 20 Drawing Sheets

U.S. PATENT DOCUMENTS

| | | | | |
|---|---|---|---|---|
| 5,771,318 | A * | 6/1998 | Fang et al. | 382/261 |
| 6,366,341 | B1 * | 4/2002 | Shirato et al. | 355/69 |
| 6,384,408 | B1 * | 5/2002 | Yee et al. | 250/252.1 |
| 6,396,059 | B1 * | 5/2002 | Singh et al. | 250/310 |
| 6,462,343 | B1 * | 10/2002 | Choo | 250/370.08 |
| 6,538,249 | B1 * | 3/2003 | Takane et al. | 250/310 |
| 6,559,446 | B1 * | 5/2003 | Choo et al. | 250/310 |
| 6,573,497 | B1 * | 6/2003 | Rangarajan et al. | 250/306 |
| 6,573,498 | B1 * | 6/2003 | Rangarajan et al. | 250/307 |
| 6,653,633 | B2 * | 11/2003 | Takane et al. | 250/310 |
| 6,700,122 | B2 * | 3/2004 | Matsui et al. | 250/310 |
| 6,807,314 | B1 * | 10/2004 | Nikitin et al. | 382/255 |
| 6,936,818 | B2 * | 8/2005 | Takane et al. | 250/310 |
| 6,995,847 | B2 * | 2/2006 | Fashant et al. | 356/445 |
| 7,078,691 | B2 * | 7/2006 | Nakayama | 250/311 |
| 7,109,485 | B2 * | 9/2006 | Takane et al. | 250/310 |
| 7,164,127 | B2 * | 1/2007 | Nakagaki et al. | 250/311 |
| 7,209,596 | B2 * | 4/2007 | Nikitin | 382/255 |
| 7,216,311 | B2 * | 5/2007 | Tanaka et al. | 716/4 |
| 2002/0081016 | A1 * | 6/2002 | Oh | 382/145 |
| 2003/0015660 | A1 * | 1/2003 | Shishido et al. | 250/311 |
| 2003/0136907 | A1 * | 7/2003 | Takane et al. | 250/310 |
| 2004/0069956 | A1 * | 4/2004 | Takane et al. | 250/492.1 |
| 2004/0156223 | A1 * | 8/2004 | Tanaka et al. | 365/145 |
| 2005/0141761 | A1 * | 6/2005 | Lee et al. | 382/145 |
| 2005/0184237 | A1 * | 8/2005 | Takane et al. | 250/311 |
| 2005/0199808 | A1 * | 9/2005 | Obara et al. | 250/310 |
| 2005/0205780 | A1 * | 9/2005 | Nakagaki et al. | 250/311 |
| 2005/0247860 | A1 * | 11/2005 | Shishido et al. | 250/210 |
| 2005/0285035 | A1 * | 12/2005 | Mizuno et al. | 250/310 |
| 2006/0060774 | A1 * | 3/2006 | Oosaki et al. | 250/307 |
| 2006/0091309 | A1 * | 5/2006 | Oosaki et al. | 250/310 |
| 2006/0108525 | A1 * | 5/2006 | Nakagaki et al. | 250/310 |
| 2006/0289756 | A1 * | 12/2006 | Nakayama | 250/310 |
| 2007/0114405 | A1 * | 5/2007 | Oosaki et al. | 250/310 |
| 2007/0187595 | A1 * | 8/2007 | Tanaka et al. | 250/307 |
| 2008/0067337 | A1 * | 3/2008 | Oosaki et al. | 250/252.1 |
| 2008/0067370 | A1 * | 3/2008 | McCaffrey | 250/306 |

OTHER PUBLICATIONS

"Sobel"—Wikipedia, http://en.wikipedia.org/wiki.Sobel.*

"Linear Filtering", http://library.wolfram.com/examples/linearfiltering/.*

Measurement Precision of CD-SEM for 65 nm Technology Node, Abe, et al, Process & Manufacturing Engineering Center, Toshiba Corp. Proc. of SPIE vol. 5375 pp. 929-939.

* cited by examiner

FIG.6
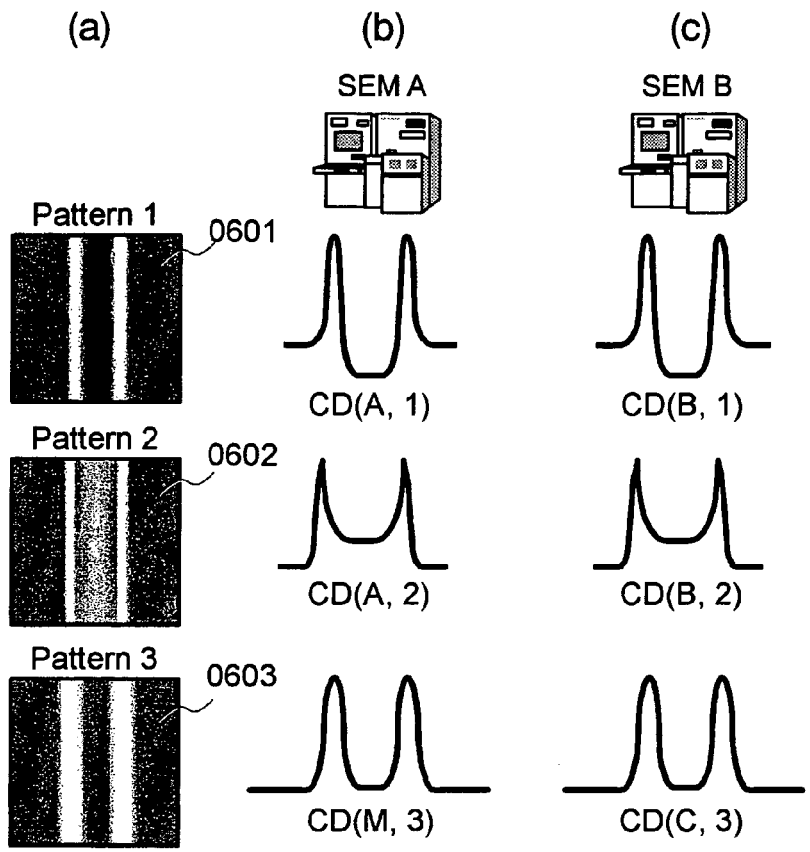
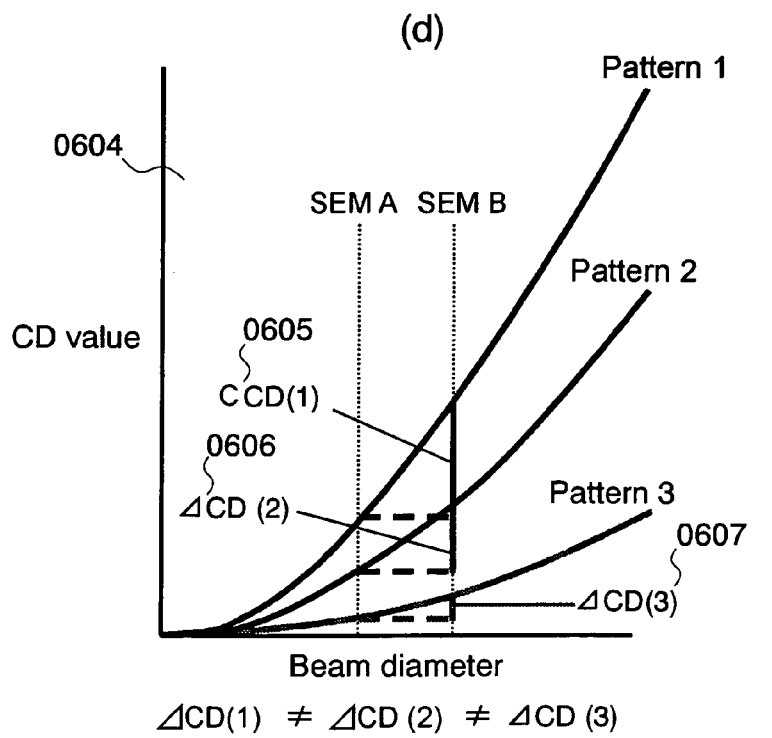
$\Delta CD(1) \neq \Delta CD(2) \neq \Delta CD(3)$

FIG.9
(a)
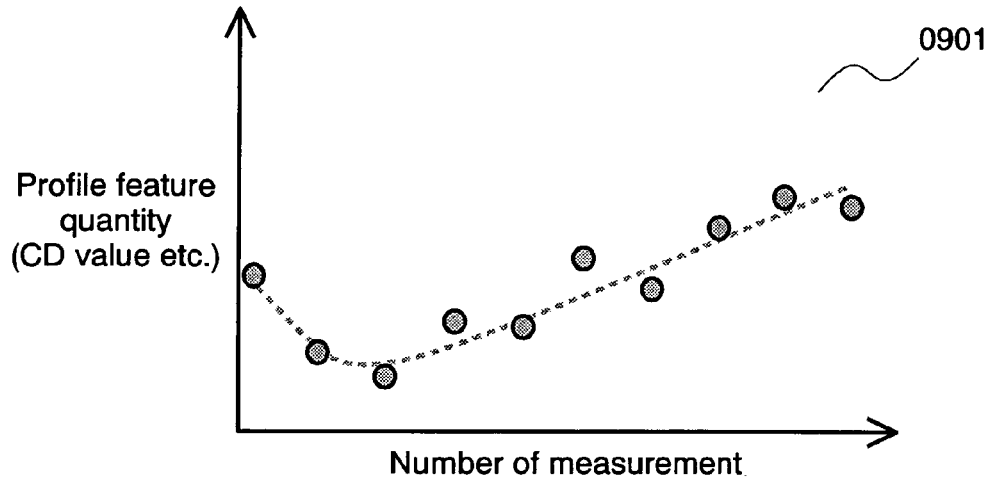
(b)
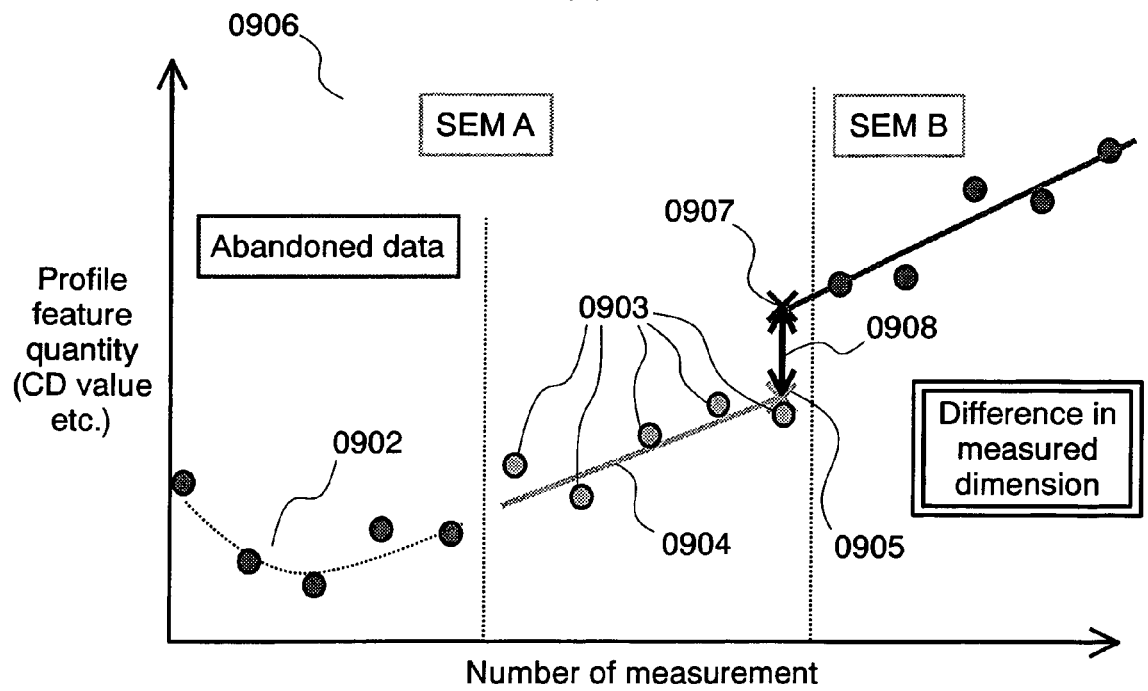

| 1801 | Evaluation pattern CD value | SEM A | SEM B | Difference between SEM's |
|---|---|---|---|---|
| | Before matching | $CD_A$ | $CD_B$ | $\Delta CD_0$ |
| | After matching | $CD_A$ | $CD_M$ | $\Delta CD_M$ |

1802 Do you want to adopt new matching operator? [Yes] [No]

(b)

| 1803 Matching operator | SEM A | SEM B |
|---|---|---|
| Before matching | $S_0$ | $S_0$ |
| After matching | $S_0$ | $S_k$ |

(c)

1804

| Feature quantity (1) | SEM A | SEM B | Difference in feature quantity between SEM's | |
|---|---|---|---|---|
| Before matching | Feature quantity 1 | Feature quantity 2 | Feature quantity 2 | − Feature quantity 1 |
| After matching | Feature quantity 3 | Feature quantity 4 | Feature quantity 4 | − Feature quantity 3 |

⋮

| Feature quantity (n) | SEM A | SEM B | Difference in feature quantity between SEM's | |
|---|---|---|---|---|
| Before matching | Feature quantity w | Feature quantity x | Feature quantity x | − Feature quantity w |
| After matching | Feature quantity y | Feature quantity z | Feature quantity z | − Feature quantity y |

| 1805 | Root mean square of differences in feature quantity |
|---|---|
| Before matching | Evaluation value 1 |
| After matching | Evaluation value 2 |

SCANNING ELECTRON MICROSCOPE, METHOD FOR MEASURING A DIMENSION OF A PATTERN USING THE SAME, AND APPARATUS FOR CORRECTING DIFFERENCE BETWEEN SCANNING ELECTRON MICROSCOPES

BACKGROUND OF THE INVENTION

This invention relates to a scanning electron microscope equipment for measuring dimensions of minute patterns, and specifically to a scanning electron microscope equipped with a function of controlling a difference in a measured dimension between scanning electron microscope equipment (hereinafter also referred to as SEM for short) and a difference caused by aging of the scanning electron microscope, a method for measuring a pattern using the same, and an apparatus for correcting a difference between scanning electron microscopes.

In the semiconductor manufacturing process, with miniaturization of patterns, dimension measurement equipment with higher measurement accuracy is sought for. Requirements for measurement accuracy include not only improvement in measurement accuracy of the measurement equipment, standing alone, but also reduction of the difference in a measured dimension among a plurality of SEM's installed in a production line and reduction of a variation in measured dimension caused by aging of the SEM.

As a dimension measuring tool for measuring the width of a fine pattern in the order of a few tens of nanometers, there has conventionally been used the scanning electron microscope for measuring a dimension that can image these patterns at 100,000-200,000 times enlargement magnification (length measuring SEM (Scanning Electron Microscope)) or a CD (Critical Dimension) SEM).

One example of dimensional measurement processing using such scanning electron microscope equipment (hereinafter referred to SEM for short) will be explained using FIG. 5. First, an image 0501 of a measurement target pattern is acquired with the scanning electron microscope equipment, then within a selection area 0502 in the acquired image, secondary electron signal waveforms 0503 of the measurement target pattern are weight-averaged in a longitudinal direction of the pattern, further the averaged result is smoothed to be an image profile (sectional waveform of the image) 0504, and finally a pattern dimension 0505 is calculated as a length between two dimensional measurement points detected in the image profile.

In such scanning electron microscope equipment, as a technique of reducing the difference in a measured dimension among a plurality of equipment and a variation in dimension caused by aging of the equipment, there is being used a method in which (1) The difference in a measured dimension between SEM's was obtained in advance by measuring the same position once with each of the plurality of SEM's, and (2) When a pattern dimension is measured by each SEM, the difference in a measured dimension between the SEM's that was obtained in the STEP (1) is added to a value of that SEM, whereby the measured dimension is matched with a measured dimension of other SEM.

Moreover, in addition to this, as a technique of measuring the difference in a measured dimension between SEM's and a variation in a dimension caused by aging of the SEM, a technique of measuring a pattern at the same position for a plurality of times with each SEM and calculating a difference of extrapolated values of the measured values obtained with respective SEM's is proposed in "Measurement Precision of CD-SEM for 65 nm Technology Node," Hideaki Abe et al., Metrology, Inspection, and Process Control for Microlithography XVIII, Proceedings of SPIE, Vol. 5375, pp. 929.[0008]

In the scanning electron microscope equipment that measures a dimension of a pattern, in the conventional technology based method for evaluating the difference in a measured dimension among the plurality of SEM's and the difference in a measured dimension caused by aging, the same position is measured once with each SEM and the difference in a measured dimension is designated as the difference in a measured dimension between SEM's and the difference in a measured dimension caused by aging. However, since the scanning electron microscope has a characteristic that (A) there is a variation in measured dimension when measuring a dimension repeatedly, and that (B) when the same position is imaged for two or more times, each dimensional measurement yields a variation in the target pattern shape and a change in material characteristics, the measurement results when measuring a pattern at the same position once with each SEM includes the difference in a measured dimension resulting from both a measurement error and a dimensional difference caused by deformation of the measurement target pattern itself as well as the difference in a measured dimension resulting from difference of the SEM.

In addition, in the conventional technology, what is used for evaluation of the difference in a measured dimension among the plurality of SEM's and the difference in a measured dimension caused by aging is a pattern measured dimension obtained from the image profile (sectional waveform of an image). On the other hand, in the dimension measurement equipment, such as scanning electron microscope equipment, that acquires an image by irradiating a beam of a finite size on it and measures a dimension using the image, one may point out as one large factor causing a large difference in a measured dimension between SEM's a difference in the shape of an electron beam between SEM's. This case has a characteristic that the difference in a measured dimension differs depending on a measured pattern shape.

FIG. 6A shows three kinds of dimensional measurement target patterns 0601, 0602, and 0603. FIG. 6B shows their image profiles when being measured by a. SEM A. FIG. 6C shows their image profiles when being measured by a SEM B. FIG. 6D schematically shows a relation between CD value and beam diameter. As shown in these figures, the scanning electron microscope equipment has a characteristic that, when the beam diameter of an electron beam is different from SEM to SEM, dimensional differences 0605, 0606, and 0607 differ from one another depending on their shapes of the dimensional measurement target pattern.

For the reasons given above, in the conventional technology, it is necessary to evaluate the difference in a measured dimension, that is, to calculate a parameter necessary for profile matching and perform matching of the difference in a measured dimension using the calculated parameter.

SUMMARY OF THE INVENTION

This invention relates to: a scanning electron microscope that can measure the difference in a measured dimension among the plurality of SEM's more accurately and consequently makes it possible to control dimensions of higher-precision wiring patterns by improving matching precision of the measured dimension between the SEM's; a method for measuring a pattern using it; and an apparatus for correcting the difference between the SEM's.

Moreover, this invention relate to: a scanning electron microscope that eliminates the need for preparing a matching parameter for each dimensional measurement target pattern by reducing the difference in a measured dimension between the SEM's through matching of image profiles (sectional waveforms of an image) obtained for the image rather than the measured dimension itself, and therefor can reduce the difference in a measured dimension between the SEM's more simply; a method for measuring a pattern using it; and an apparatus for correcting the difference between the SEM's.

That is, this inventions provides scanning electron microscope equipment having the following two functions or an SEM system including the scanning electron microscope equipment.

(1) A function that makes each SEM measure a pattern at the same position for a plurality of times and calculates a difference between extrapolated values of measured values obtained by the respective SEM's, as a method for evaluating the difference in a measured dimension among the plurality of SEM's and the difference in a measured dimension caused by aging. This function makes is possible (A) to obtain a value closer to a true value from measured dimension values with a variation, and (B) to find the difference in a measured dimension resulting from difference of SEM more correctly by calculating an amount of dimensional variation due to deformation of the measurement target pattern itself and subtracting it from the measured dimension.

(2) A function of matching the difference in a measured dimension between the plurality of SEM's and the difference in a measured dimension caused by aging. Specifically, this is a function whereby more than one profile feature quantity is used for evaluation of the difference in a measured dimension and reduction of the difference in a measured dimension is achieved by matching image profiles (sectional waveform of an image). The profile feature quantity is a shape index-value obtained from image profile information as shown in FIG. 5D. For example, there can be listed the pattern dimension 0505 described above, a distance 0506 between right and left peaks of a profile, a space 0507 between the right and left peaks of the profile, a width 0508 of the peak part of the profile, a gradient 0509 of the profile, etc. and a sharpness of the profile peak, a shape of the profile itself, and the like. Thus, by matching image profiles obtained by the plurality of SEM's with each other with an operator for simulating a difference of the beam diameter, it becomes possible to reduce the difference in a measured dimension between the SEM's without depending on both a shape of a dimensional measurement pattern and a position of dimensional measurement on the image profile.

That is, this invention provides a method for measuring a dimension of a pattern using a scanning electron microscope that comprises the steps of: scanning a sample on whose surface a pattern is formed by irradiating an converged electron beam on it; acquiring an image of the pattern formed on the surface of the sample by detecting secondary electrons generated from the sample by irradiation of the converged electron beam; reading a filter parameter by which feature quantities of image profiles are matched with each other between the SEM's and that is stored in the storage means in advance; creating an image profile from the image of the profile acquired using the read filter parameter; whereby a dimension of the pattern is measured from the created image profile. It is further specified that the filter parameter by which the feature quantities of the image profiles are matched with each other between the SEM's is a parameter used to reduce a difference in the feature quantity of a pattern image profile between the SEM's when measuring the same pattern formed on the sample.

Moreover, this invention provides a method for measuring a dimension of a pattern using a scanning electron microscope that comprises the steps of: designating a scanning electron microscope serving as a reference in pattern dimension measurement; designating a scanning electron microscope to be calibrated whose image profile will be matched with an image profile of the dimensional measurement pattern of the designated scanning electron microscope; imaging the dimensional measurement pattern by the designated scanning electron microscope serving as a reference and obtaining the feature quantity of an image profile of the dimensional measurement pattern; imaging the dimensional measurement pattern by the scanning electron microscope to be calibrated and obtaining the feature quantity of an image profile of the dimensional measurement pattern; finding a parameter by which the feature quantity of an image profile of the dimensional measurement pattern obtained by imaging with the designated scanning electron microscope serving as a reference is matched with the feature quantity of an image profile of the dimensional measurement pattern obtained by imaging with the scanning electron microscope to be calibrated; correcting an image of the sample obtained by imaging with the scanning electron micro scope to be calibrated using the parameter by which the feature quantities of the obtained image profiles are matched with each other; and finding a dimension of the pattern of the sample from the corrected image.

Furthermore, in this invention, an apparatus—for correcting a difference between SEM's—that corrects a difference among a plurality of scanning electron microscopes each for measuring a dimension of a pattern is constructed to comprise: designation means for designating both a scanning electron microscope serving as a reference in pattern dimension measurement and a scanning electron microscope to be calibrated that has an image profile of the dimensional measurement pattern with which that of the scanning electron microscope serving as a reference is matched; first storage means for storing the feature quantity of an image profile of the dimensional measurement pattern obtained by imaging the dimensional measurement pattern with the scanning electron microscope serving as a reference designated by the designation means; second storage means for storing the feature quantity of an image profile of the dimensional measurement pattern obtained by imaging the dimensional measurement pattern with the scanning electron microscope to be calibrated that was designated by the designation means; parameter calculation means for calculating a parameter by which the feature quantity of an image profile of the dimensional measurement pattern stored in the first storage means is matched with the feature quantity of an image profile of the dimensional measurement pattern stored in the second storage means; image correction means for correcting an image of the sample obtained by imaging with the scanning electron microscope to be calibrated using the parameter that is used for matching and calculated by the parameter calculation means; dimension measurement means for finding a dimension of a pattern of the sample from the image corrected by the image correction means.

The scanning electron microscope equipment (SEM) according to this invention can measure the difference in a measured dimension among the plurality of SEM's more accurately, and accordingly precision of matching of the measured dimension between the SEM's is made high; therefore, it becomes possible to control dimensions of higher-precision wiring patterns, leading to performance improvement of measurement target products.

Moreover, since the scanning electron microscope equipment reduces the difference in a measured dimension between the SEM's, the scanning electron microscope equipment can eliminate the need for preparing a parameter of each dimensional measurement target pattern by matching image profiles (sectional waveform of an image) obtained from an image rather than the measured dimension itself, and thereby can reduce the difference in a measured dimension between the SEM's more simply.

These and other objects, features and advantages of the invention will be apparent from the following more particular description of preferred embodiments of the invention, as illustrated in the accompanying figures.

BRIEF DESCRIPTION OF THE DRAWINGS

FIG. 6A is scanning electron microscope images of patterns 1-3.

FIG. 6B is image profiles of the images whose one-line waveforms are smoothed in the X-direction, respectively, when the scanning electron microscope images of the patterns 1-3 are acquired by the SEM A.

FIG. 6C is an image profile of the image whose one line waveform is smoothed in the X-direction when the scanning electron microscope images of the patterns 1-3 are acquired by the SEM B.

FIG. 6D is a graph showing a relation between CD value and beam diameter.

FIG. 9A is a graph showing a relation between profile feature quantity and the number of measurements at the same position of the measurement target pattern.

FIG. 9B is a graph showing a relation between profile feature quantity and the number of measurements at the same position of the measurement target pattern when the position is measured repeatedly by the SEM A, part of the way, and measured repeatedly by the SEM B, the rest of the way.

FIG. 18A is a GUI that displays CD values and a difference between the SEM A and the SEM B before and after matching of profiles of the SEM A and the SEM B, and displays a button through which adoption of a new operator is entered.

FIG. 18B is a GUI that shows operators of the SEM A and the SEM B before profile matching and a newly calculated operator.

FIG. 18C is a GUI that displays profile feature quantities of the SEM A and the SEM B before profile feature matching between the SEM A and the SEM B is performed, and profiles of the SEM A and the SEM B after the matching was done.

DESCRIPTION OF THE PREFERRED EMBODIMENTS

Hereafter, an embodiment of this invention will be described.

It is the object of this invention to reduce a difference in a measured dimension between SEM's in scanning electron microscope equipment system for measuring dimensions of a pattern from images obtained by scanning electron microscope equipment imaging a fine pattern.

(1) Outline of this Invention

Figure 16:
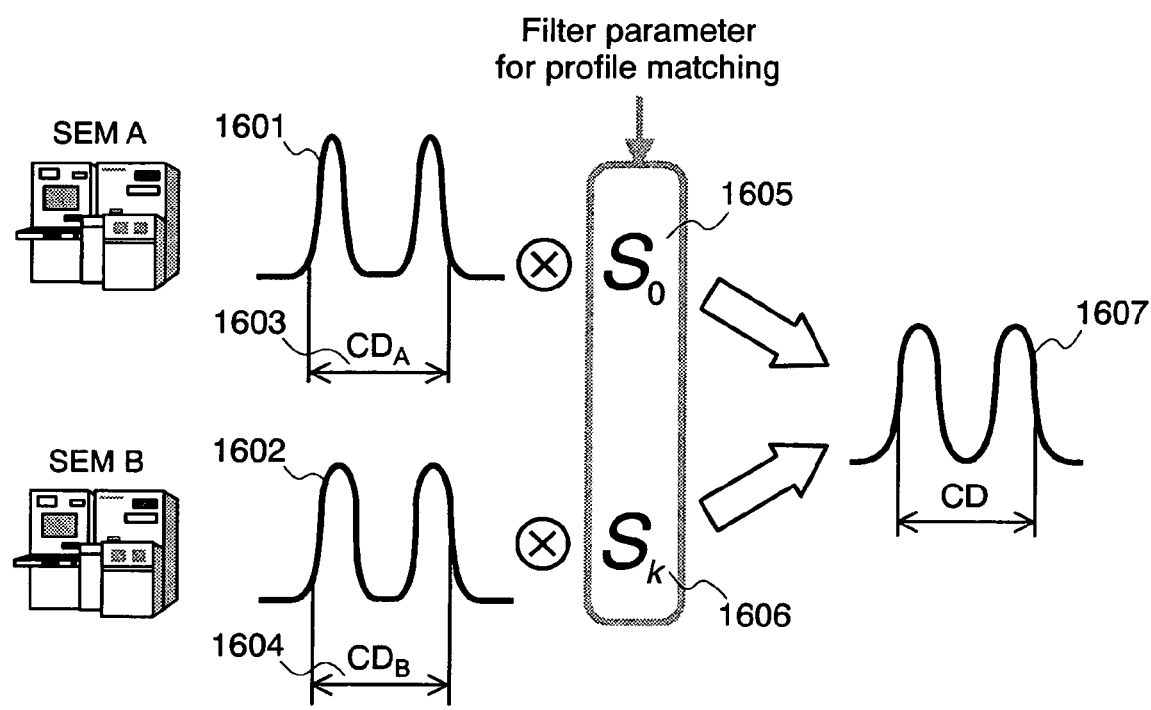
FIG. 16 is a diagram schematically showing processing of image profile matching according to this invention.

In the scanning electron microscope equipment that acquires an image by scanning an electron beam on a sample, a difference of a beam shape depending on an SEM is a main factor causing the difference in a measured dimension between the SEM's. FIG. 16 schematically shows a difference of image profile between the SEM's. The figure is for a case where the SEM B is assumed to have a larger beam diameter than the SEM A. An image profile 1601 acquired by the SEM A on the same sample and an image profile 1602 acquired by the SEM B differ from each other, and CD values ($CD_A$ 1603 and $CD_B$ 1604) obtained from the respective image profiles also differ from each other.

In this invention, a filter that considers the difference of a beam shape between the SEM's is made to produce an effect on image profiles obtained by the respective SEM's, whereby the image profiles acquired by the plurality of SEM's are matched with each another. For example, as shown in FIG. 16, the SEM A and the SEM B are configured to be able to render the same image profile 1607 by making a filter with a filter parameter $S_0$ 1605 produce an effect on the image profile 1601 acquired by the SEM A and making a filter with a filter parameter $S_k$ 1606 that considers the difference of a beam shape between the SEM's produce an effect on the image profile 1602 acquired by the SEM B.

In this embodiment, a scanning electron microscope capable of reducing the difference in a measured dimension between the SEM's using a technique described above and an scanning electron microscope equipment system including the SEM will be described below.

(2) Configuration of Scanning Electron Microscope Equipment, Standing Alone

Figure 1:
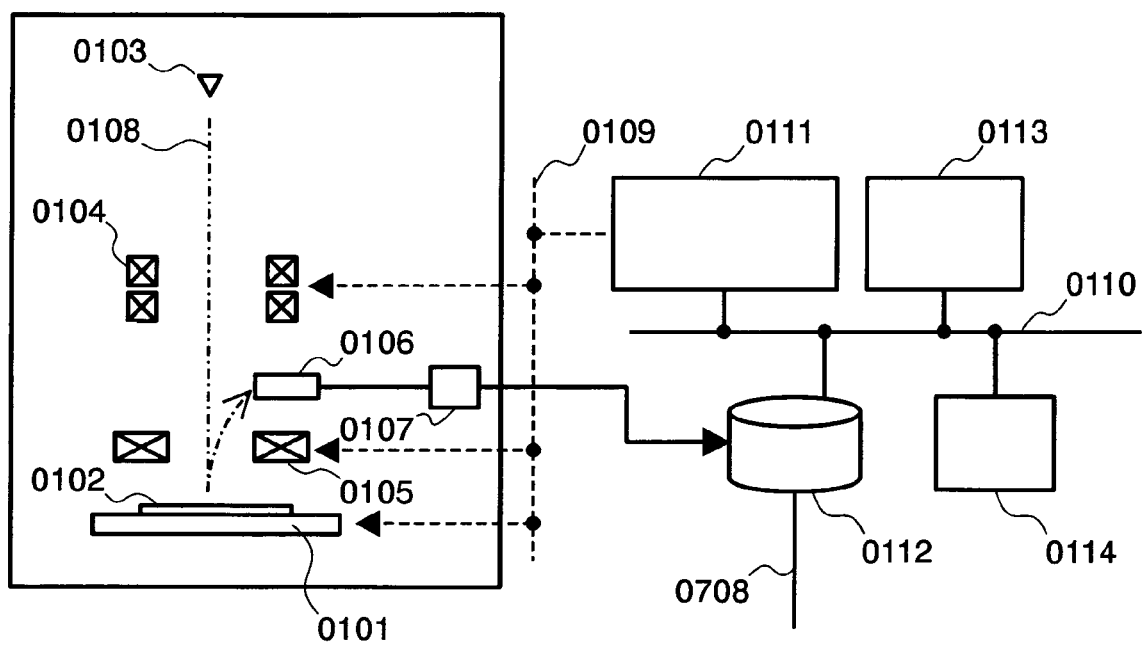
FIG. 1 is a view showing an equipment configuration of scanning electron microscope equipment, standing alone.

FIG. 1 shows a configuration of scanning electron microscope equipment, standing alone, according to this invention.

This equipment is broadly divided into two component parts: an electron optics system for acquiring electron beam images; and an information processing system for measuring a target pattern by processing these images. Main constituents of the electron optics system are: a stage 0101 for carrying a sample 0102; an electron source 0103 for emitting an electron beam 0108; a deflection lens 0104 for deflecting the electron beam 0108; an objective lens 0105; a secondary electron detector 0106 having a function of converting secondary electrons emitted from the sample into an electric signal; an A/D converter for convening the detected electric signal into a digital signal; and a control unit 0111 for controlling the above-mentioned units.

On the other hand, main constituents of the information processing system for measuring a taken-image pattern from an image data are: a processing unit 0113 for performing image processing etc.; a storage unit 0112 for storing image data and various data to be used in other processing; and an input/output unit 0114 having a function of allowing the user to input imaging conditions and a parameter of image processing and outputting obtained results; these constituents being constructed to transmit and receive the data mutually through a data bus 0110. Moreover, the storage unit 0112 is constructed to be able to transmit and receive the data to and from external devices, such as the scanning electron microscope and data processing equipment, through a data bus 0708. Note that the control unit 0111 in this figure shall perform not only a control of the electron optics system but also a control in measuring a dimension of a pattern from a taken image.

(3) Method for Measuring a Pattern Dimension with Scanning Electron Microscope

Figure 2:
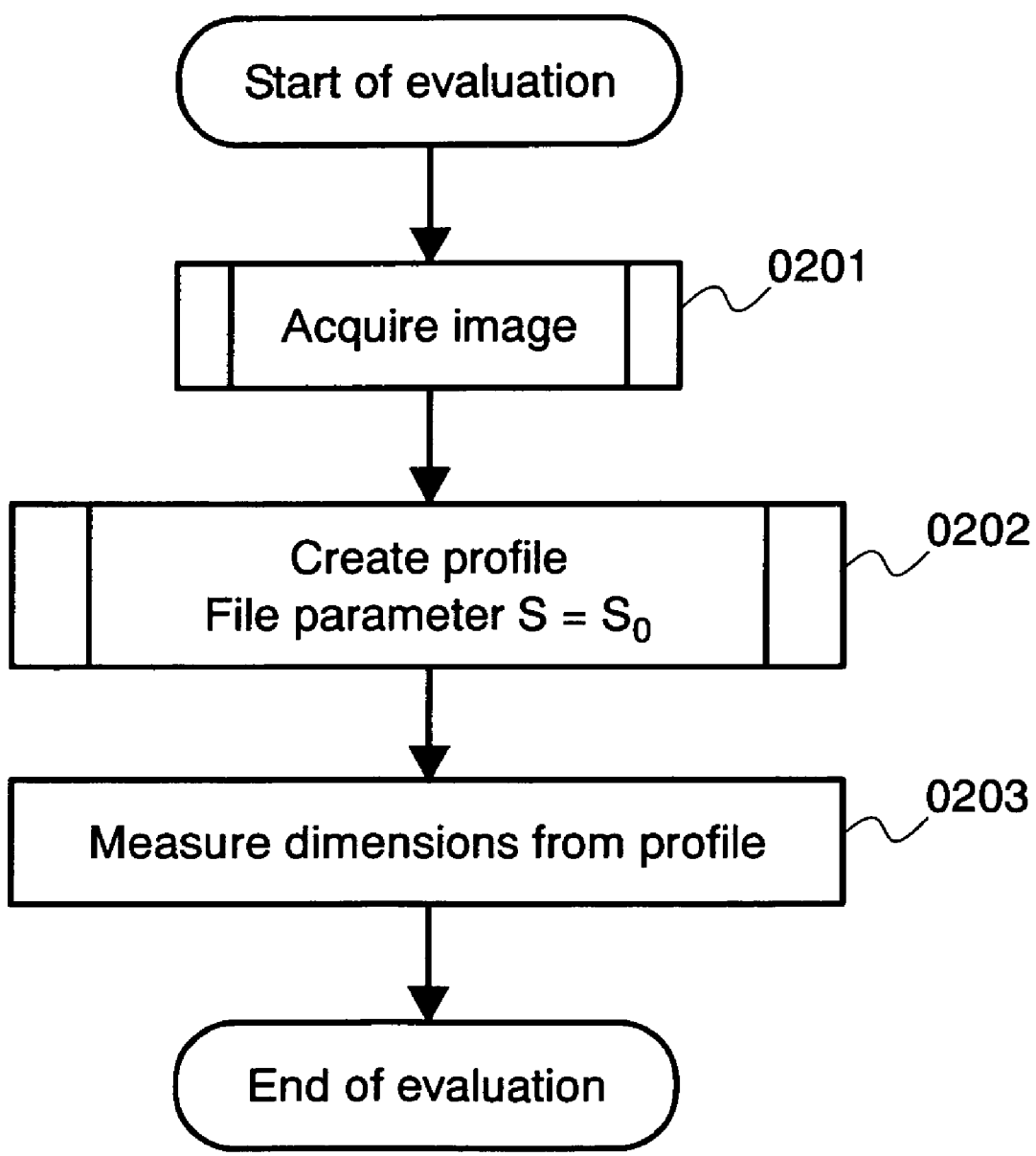
FIG. 2 is a pattern dimension measurement sequence in the scanning electron microscope equipment.

FIG. 2 shows the entire sequence of dimensional measurement processing of a pattern. In the entire sequence, first an image is acquired (STEP 0201), next an image profile is created (STEP 0202), then a dimension is measured from the image profile 0504 (STEP 0203), and evaluation is ended.

To begin with, the image acquisition sequence (STEP 0201) or a first step of FIG. 2 will be explained according to FIG. 3. First, the sample 0102 containing a dimensional measurement target pattern is set on the stage 0101 (STEP 0301). Next, the control unit 0111 outputs an instruction so that the stage 0101 is moved to a position at which an image of the dimensional measurement target pattern can be acquired by electron beam irradiation (STEP 0302). Next, the electron gun 0103 emits the electron beam 0108 and the primary electron beam deflector 0104 deflects the electron beam 0108, whereby the electron beam is scanned on the sample 0102 on the stage 0101 (STEP 0303). At this time, in order to take an image at an in-focus position, an objective lens is controlled.

Next, a secondary electron signal emitted from the sample 0102 by electron beam scanning is acquired with the secondary electron detector 0106 (STEP 0304). Moreover, in that occasion, a setup value of the objective lens 0105 (objective lens control value when an image is taken actually) is read from the control unit 0111 and an imaging magnification of an image is stored in the storage unit 0112. The reason for storing this value is that the magnification of the taken image varies slightly depending on setting of the objective lens, and consequently is indispensable to make the following dimensional calculation processing reflect this slight variation value of magnification in calculating a correct dimension value. Next, the acquired secondary electron signal is A/D converted by an A/D converter 0107, then subjected to pre-processing, such as noise processing, and subsequently stored in the storage unit 0112 in the form of a two-dimensional digital image (STEP 0305). By the processing up to this step, a scanning electron microscope image 0501 including an image of a region of the dimensional measurement target pattern is acquired.

Next, an image profile creation sequence (STEP 0202) or a second step of FIG. 2 will be explained according to FIG. 4. First, in the acquired scanning electron microscope image 0501 shown in FIG. 5A, the image area 0502 necessary for profile creation is chosen (STEP 0401). The necessary image selection area 0502 means as follows: in a dimensional measurement direction (hereinafter referred to as X-direction), it is an area containing at least the whole region of the dimensional measurement target pattern; and in a direction perpendicular to this (hereinafter referred to as Y-direction), it is an area containing the number of pixels necessary for processing of averaging values of pixels at each X coordinate in the Y-direction (a few hundred pixels). If the number of pixels used for averaging the pixel values is large, a noise component peculiar to the scanning electron microscope can be reduced. Incidentally, the selection area in both X- and Y-directions can be altered properly depending on a shape of the dimensional measurement target pattern. Next, in the selected image area 0502, processing of averaging pixel values at each X coordinate in the Y-direction is performed to create the one-line waveform 0503 in the X-direction, as shown in FIG. 5B (STEP 0402). Finally, by making a filter with the specified parameter (STEP 0403) produce an effect on the obtained one-line waveform and thereby smoothing it (STEP 0404), the image profile 0504, as shown in FIG. 5C, is created. Here, the filter processing (STEP 0404) may be performed as required, but it is not necessary to be so performed.

Figure 3:
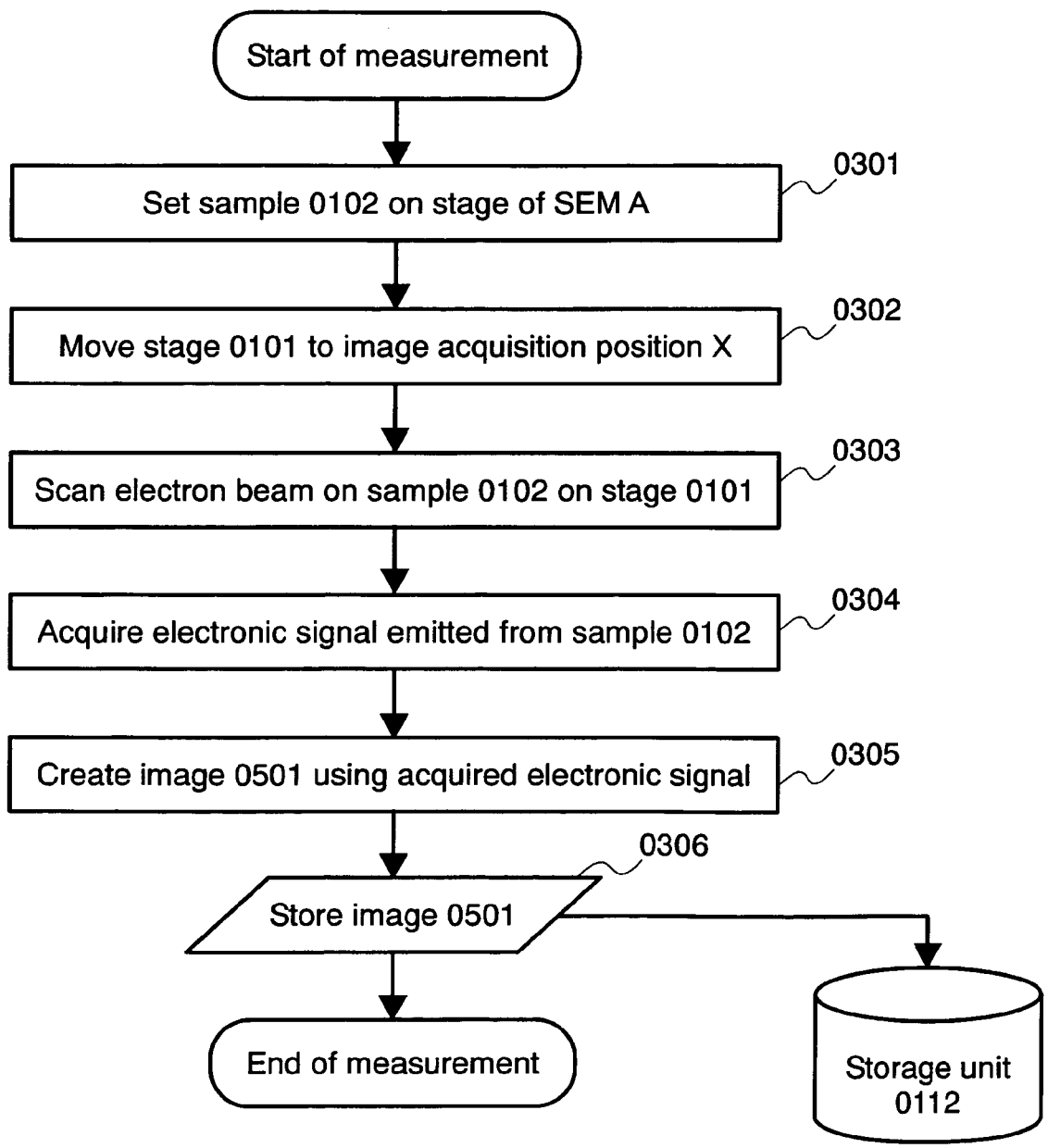
FIG. 3 is an image acquisition sequence in the scanning electron microscope equipment.

Next, dimensional measurement (STEP 0203) from the image profile 0504 or a third step of FIG. 3 is performed. As the method for calculating a pattern dimension, there are various methods. For example, as shown in FIG. 5D, X-direction coordinates at which the image profile takes a mean value to a maximum value and a minimum value thereof are calculated from right and left outer inclined parts, ad a width of the two points is designated as the CD value 0505.

The above is the contents of dimensional measurement processing of the dimensional measurement target pattern by scanning electron microscope equipment.

In the SEM according to this invention, the image profile 0504 is created from the scanning electron microscope image 0503 of the acquired dimensional measurement target pattern, and the profile matching processing between the SEM's that will be described later is applied to the image profile 0504 of the dimensional measurement target pattern so as to perform pattern measurement.

In this invention, an operator for processing of profile matching between the SEM's shall be applied in measuring a dimension, which is made possible by evaluating a difference in a profile feature quantity between the SEM's and specifying the matching operator in advance. Here, the profile feature quantity means a shape index-value obtained from image profile information as shown in FIG. 5D. For example, when the profile has two (right and left) protruded shapes (named as profile peaks) as shown in FIG. 5D, the shape index-value may include the CD value 0505 described above, the distance 0506 between centers of the right and left profiled peaks, the distance 0507 between right and left profile peaks, the widths 0508 of the profile peak parts, the gradient 0509 of the profile, etc. sharpness of the profile peaks, a shape of the profile itself, etc.

Concrete contents of this invention will be explained below. Explanations are given as follows: (4) first, a configuration of an SEM system according to this invention; (5) subsequently, evaluation of the difference in a profile feature quantity between the above-mentioned SEM's and a setting sequence of an operator for processing of profile matching; and (6) a dimension measurement sequence to which the technique of profile matching being set is applied.

(4) Configuration of Scanning Electron Microscope Equipment System

Figure 7:
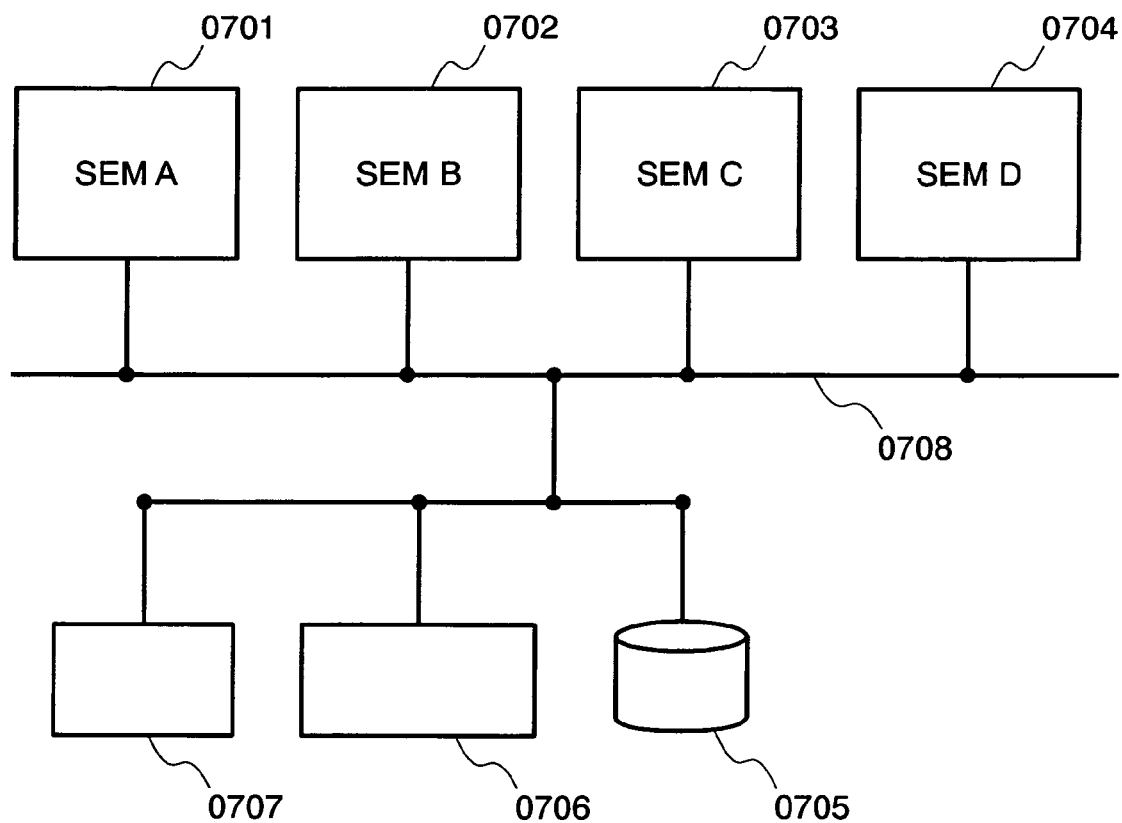
FIG. 7 is a diagram showing a system configuration of scanning electron microscope equipment (also SEM for short) according to this invention.

FIG. 7 shows a configuration of an scanning electron microscope equipment system according to this invention. This system comprises one or more scanning electron microscope equipment shown in FIG. 1 and an information processing system that evaluates a difference in a dimension among these SEM's and performs processing necessary to reduce the difference in a dimension. This system has scanning electron microscopes 0701-0704, a storage unit 0705 for storing an image acquired by each SEM and various data obtained from the acquired image, a processing unit 0706 for performing evaluation of the difference in a dimension by each SEM from the image acquired with each SEM etc., and an input/output unit 0707 having a function that allows the user to enter necessary parameters and outputs results, each of which can transmit/receive data mutually through the data bus 0708. Moreover, this system is configured to be able to transmit and receive data to and from the scanning electron microscope equipment 0701-0704 through the storage unit of each SEM. Note here that the storage unit 0112 and the processing unit 0113 in one of the scanning electron microscope equipment 0701-0704 may serve as the storage unit 0705 and the processing unit 0706, respectively.

(5) Setting Sequence of Operator for Evaluating the Difference in a Profile Feature Quantity Between the SEM's and for Processing of Profile Matching A setting sequence of an operator for evaluating the difference in a profile feature quantity between the SEM's and for processing of profile matching, shown in FIG. 8, will be explained. In this embodiment, it is assumed that the plurality of SEM's that are evaluation targets are two SEM's: the SEM A0701 and the SEM B0702.

(5-1) Method for Acquiring Image Used for Evaluation of the Difference in a Profile Feature Quantity Between the SEM's First, an image acquisition sequence (STEP 0801) for acquiring an image of the same pattern for a plurality of times for evaluation of the difference in a profile feature quantity between the SEM's or a first step of FIG. 8 will be explained.

In order to match profile feature quantities between the SEM's, it is preferable for all the SEM's to acquire images of the same sample at the same position. However, in the case where an image is acquired using a scanning electron microscope, since contaminant adherence to a sample occurs each time an image is acquired, there is a problem that an imaged pattern itself will deform during when an image of the pattern is being acquired at the same position for a plurality of times. In this case, as shown in FIG. 9A, since each time an image is acquired the profile feature quantity of the same pattern will change, it is necessary to separate and evaluate the difference in a profile feature quantity stemming from the SEM's and deformation of the measurement target pattern itself in evaluating the difference in a profile feature quantity between the SEM's.

Since a tendency as shown in FIG. 9A is observed in a variation in the profile feature quantity of the measurement target pattern caused by contaminant adherence, the amount of deformation of the measurement target pattern itself can be estimated by performing measurement at the same position with the same SEM for a plurality of times. In addition to this, there exists a variance in the measured dimension at the time of repeated dimensional measurement in the scanning electron microscope equipment. Therefore, in order to improve reliability of the measured dimension, a larger number of measurement at the same position with the same SEM's preferable (for example, 10 times). For the reason given above, an image at the same position on the same sample is acquired for a plurality of times by each SEM Its concrete image acquisition sequence will be explained according to FIG. 10. First, the number of image acquisitions $N_A$ by the SEM A is specified (here, $N_A$ is 2 times or more as stated previously) (STEP 1001). Next, an image of the measurement target pattern is acquired at an image acquisition position X=P for a specified number of image acquisitions (STEPS 1002-1005). At this time, a shape of the measurement target pattern is arbitrary. However, since reduction of the difference in a measured dimension between the SEM's is the purpose of this invention, a line pattern extending in one direction as shown in FIG. 5A and a hole pattern that are general dimensional measurement targets are preferable.

Moreover, if similar patters exist repeatedly within the same image, as shown in FIG. 5E, a repetition pitch 0511 can be measured from intervals of the same position corresponding to each pattern as shown in FIG. 5E, and therefore an error of comparative magnification between the SEM's can be evaluated; therefore, such a pattern is more preferable.

Moreover, when an image at the same position is acquired continuously, if an image acquisition time is short, charge is generated on the sample surface depending on a material of the sample, which may produce an image different from that without charge. Therefore, the image acquisition time interval needs to be sufficiently widened (for example, 10 seconds or more is interposed between acquisition of a first image and a start of acquisition of the next image). Moreover, ultraviolet light may be irradiated on the sample surface to intend to remove the charge thereon. Thus, it is preferable to acquire an image under image acquisition conditions where image variation factors irrelevant to the difference in a measured dimension between the SEM's are removed as much as possible.

After an image at the same position was acquired for a plurality of times by the SEM A in this way, the sample is moved into the SEM B (STEP 1006).

Next, the number of image acquisitions $N_B$ by the SEM B is specified (here, $N_B$ is 2 times or more as stated previously)

(STEP 1007). Next, an image of the measurement target pattern is acquired at an image acquisition position X=P for a specified number of image acquisitions (STEPS 1008-1011). Note here that, in the SEM A and the SEM B, an image is acquired at the same position and that the number of image acquisitions by the SEM A and by the SEM B may be the same or may be different. The above sequence enables acquisition of images that are necessary for evaluation of the difference in a profile feature quantity between the SEM's—the profile feature quantity being acquired by the SEM A and by the SEM B, respectively—and setting of a technique of profile matching between the SEM's.

(5-2) Method for Calculating the Difference in a Profile Feature Quantity Between the SEM's Next, a calculation sequence of the difference in a profile feature quantity between the SEM's (STEP 0802) or a second step of FIG. 2 will be explained according to FIG. 11. First, the profile feature quantity by the SEM A is calculated by extrapolation (STEP 1101). Here, this method for extrapolating profile feature quantities will be explained according to FIG. 12.

First, the number of image acquisitions by the SEM is set up (STEP 1201). In this embodiment, the number of image acquisitions by the SEM A is $N_A$. Next, images that are not used for extrapolation are chosen (STEP 1202). In this embodiment, images that are not used for extrapolation among the acquired images by the SEM A are those of 0-th to $N_U$-th acquisition. Here, the images that are not used for extrapolation are images whose profile feature quantities are unstable and that are observed for first several acquisitions 0902 when imaging is done at the same position for a plurality of times, as shown in FIG. 9A. In such a case, since exclusion of data for that period makes it possible to obtain a more correct extrapolated value, they shall be not used for extrapolation. Moreover, instead of excluding the data of first several times, the position may be irradiated with an electron beam in advance, so that images whose profile feature quantity varies stably are intended to be obtained.

Next, a setting as to in which time of image acquisition the profile feature quantity obtained by extrapolation lies is made (STEP 1203). In this embodiment, the profile feature quantity by the SEM A lies in a T-th image acquisition (T denotes an arbitrary integer). Next, a filter parameter at the time of profile creation is set up (STEP 1204). In this embodiment, the filter parameter by the SEM A is $S_0$. As described above, after each parameter was set up and subsequently a profile was created for images of $(N_U+1)$-th acquisition to $N_A$-th acquisition, one or more profile feature quantity 0903 is calculated from each image profile (STEPS 1205-1210).

Finally, as shown in FIG. 9B, a relation between profile feature quantity and the number of image acquisitions is put into a first approximation 0904 and a profile feature quantity 0905 corresponding to the T-th image acquisition on an approximate straight-line is calculated by extrapolation as a profile feature quantity by the SEM A (STEP 1211). Through the above processing shown in FIG. 12, an extrapolated value of the profile feature quantity when an image is acquired at the same position for plurality of times by the SEM A is calculated.

Figure 11:
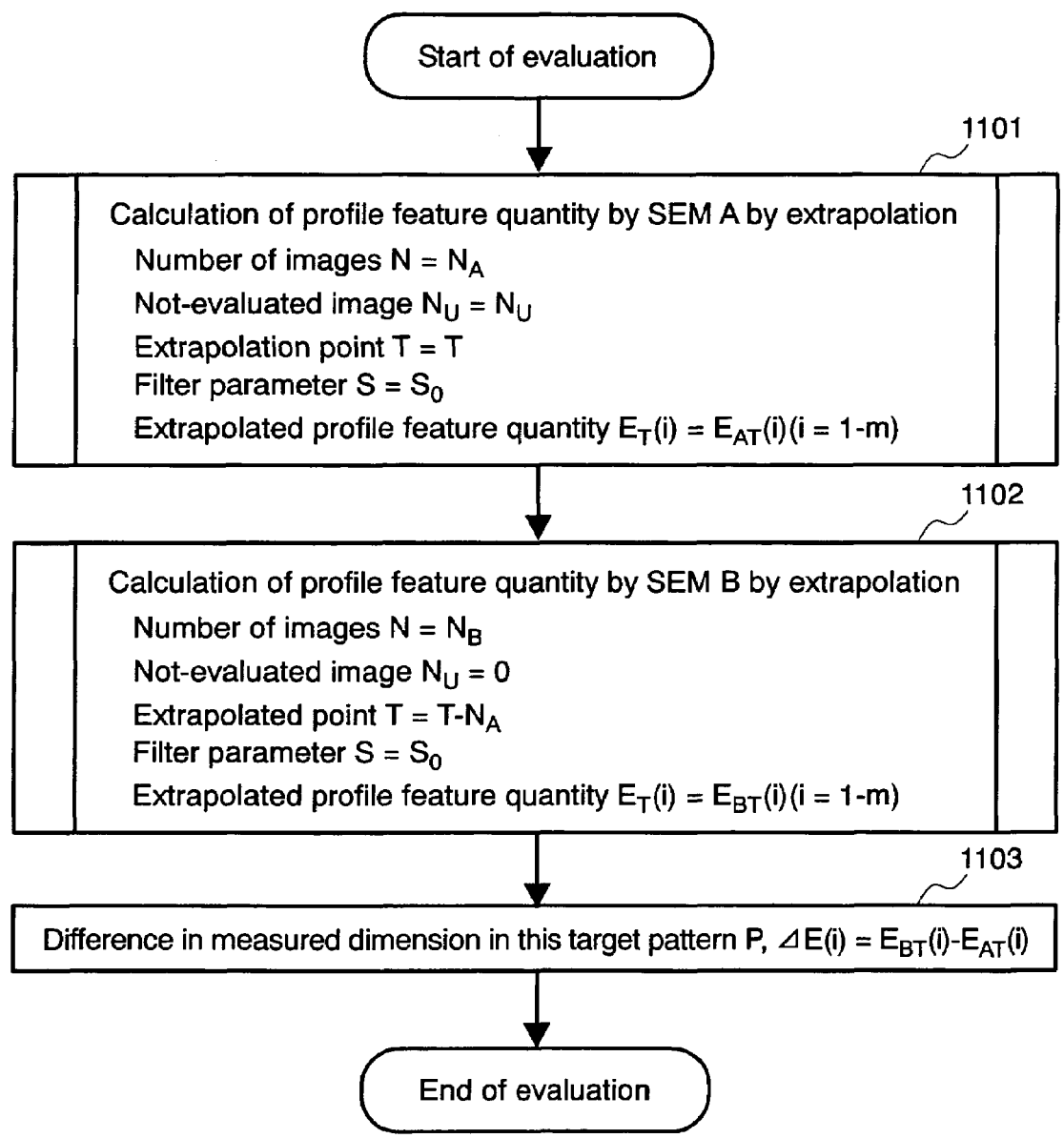
FIG. 11 is an evaluation sequence of the difference in a measured dimension between the SEM's according to this invention.
Figure 12:
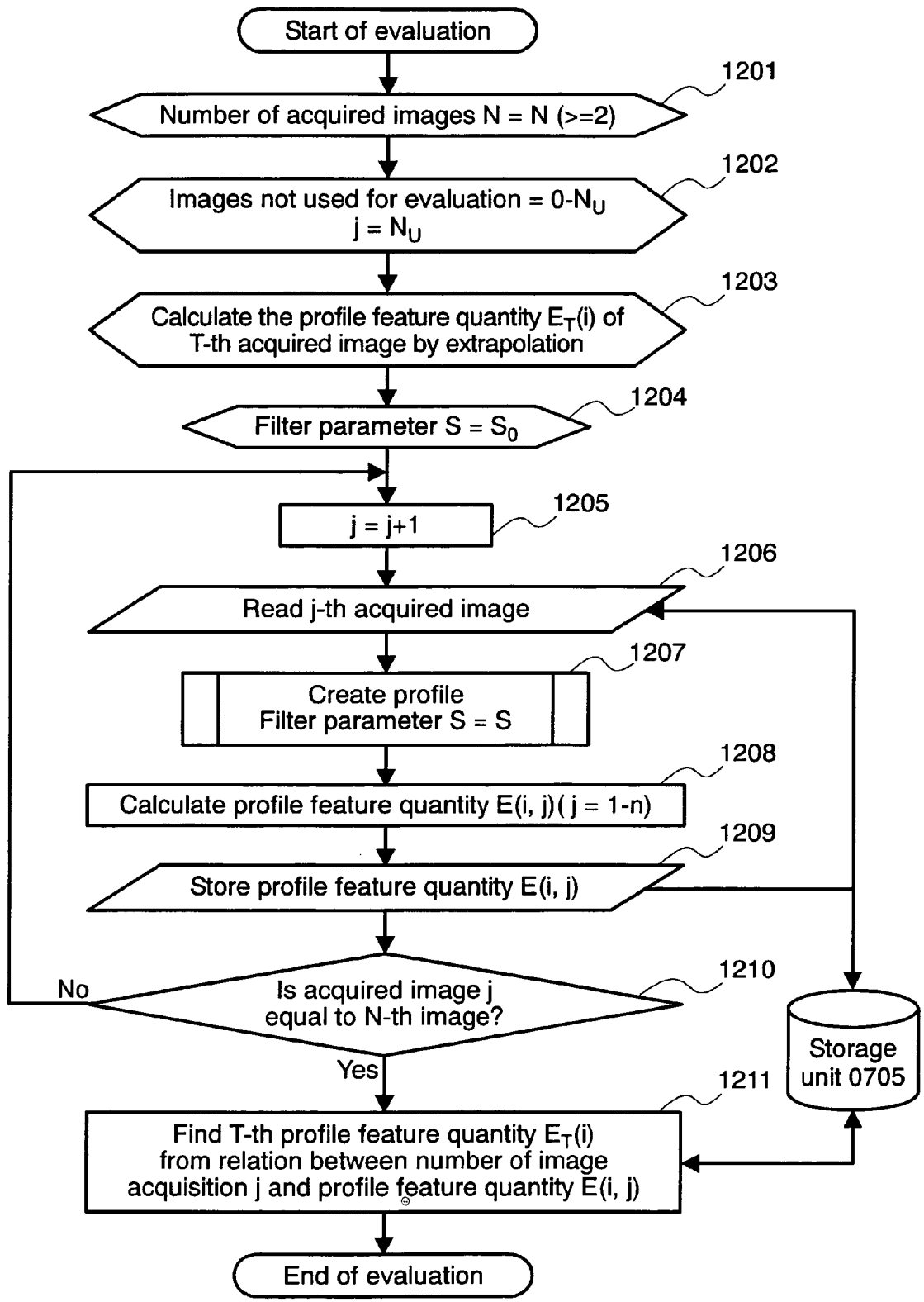
FIG. 12 is a calculation sequence of the profile feature quantity obtained by imaging the same position more than once.

Next, the flow proceeds to the next STEP 1102 of FIG. 11, and an extrapolated value 0907 of the profile feature quantity is similarly calculated also for an acquired image by the SEM B according to the sequence of FIG. 12. Here, two points are important: the filter parameter of the SEM B is the same as that of the SEM A, and a profile feature quantity obtained by extrapolation corresponds to a (T–NA)-th image (the number of image acquisitions by the SEM A is $N_A$ times, and the extrapolated value is for the T-th image acquisition) that was acquired by the SEM B. This is because the profile feature quantity obtained by each SEM needs to be a value calculated with an assumption that an image is acquired at the same position on the same wafer for the same number of times.

In FIG. 9B in this embodiment, because the number of image acquisitions by the SEM A: $N_A=10$ and the number of image acquisitions to find an extrapolated value of the profile feature quantity: T=10, an extrapolated value of the profile feature quantity when the number of image acquisitions by the SEM B: $T-N_A=10-10=0$ is obtained. Finally, when a difference 0908 in extrapolated value of the profile feature quantity between the SEM A and the SEM B is calculated (STEP 1103), it becomes a difference in a profile feature quantity between the SEM's for the measurement target pattern. This is calculated for each profile feature quantity.

(5-3) Method for Calculating Profile Matching Operator Between the SEM's

Next, an operator calculation sequence for processing of profile matching between the SEM's (STEP 0803) or a third step of FIG. 8 will be explained according to FIG. 13.

In this embodiment, taking a case where the profile matching operator is a filter for smoothing used in creating an image profile as an example, matching of the profiles is performed by altering a parameter of a filter that is made to produce an effect on the image data relative to a filter (parameter $S_0$) that is made to produce an effect on the image data in creating an image profile by the SEM A serving as a reference.

First, a profile index-value by the SEM A is calculated by extrapolation (STEP 1301). At this time, the filter parameter at the time of profile creation is $S_0$. Next, a search range of the filter parameter by which the profile by the SEM B can be best matched with the profile by the SEM A is set up (STEP 1302). Hereafter, the difference in a feature quantity between the SEM's when using each filter parameter within the search range is calculated (STEPS 1303-1309). First, the profile feature quantity with a filter parameter S(k) in the SEM B is found by extrapolation (STEP 1305).

Next, a difference $\Delta E(i, k)$ in the profile feature quantity between the SEM A and the SEM B is calculated (STEP 1307). Next, a root mean square of the difference $\Delta E(i, k)$ in the profile feature quantity between the SEM's is found and designated as a difference $\Delta E(k)$ between the SEM A and the SEM B in the evaluation target pattern (STEP 1308). After the above processing was performed for each filter parameter, a filter parameter by which the difference $\Delta E(k)$ between the SEM A and the SEM B becomes a minimum is searched (STEP 1310).

Figure 14:
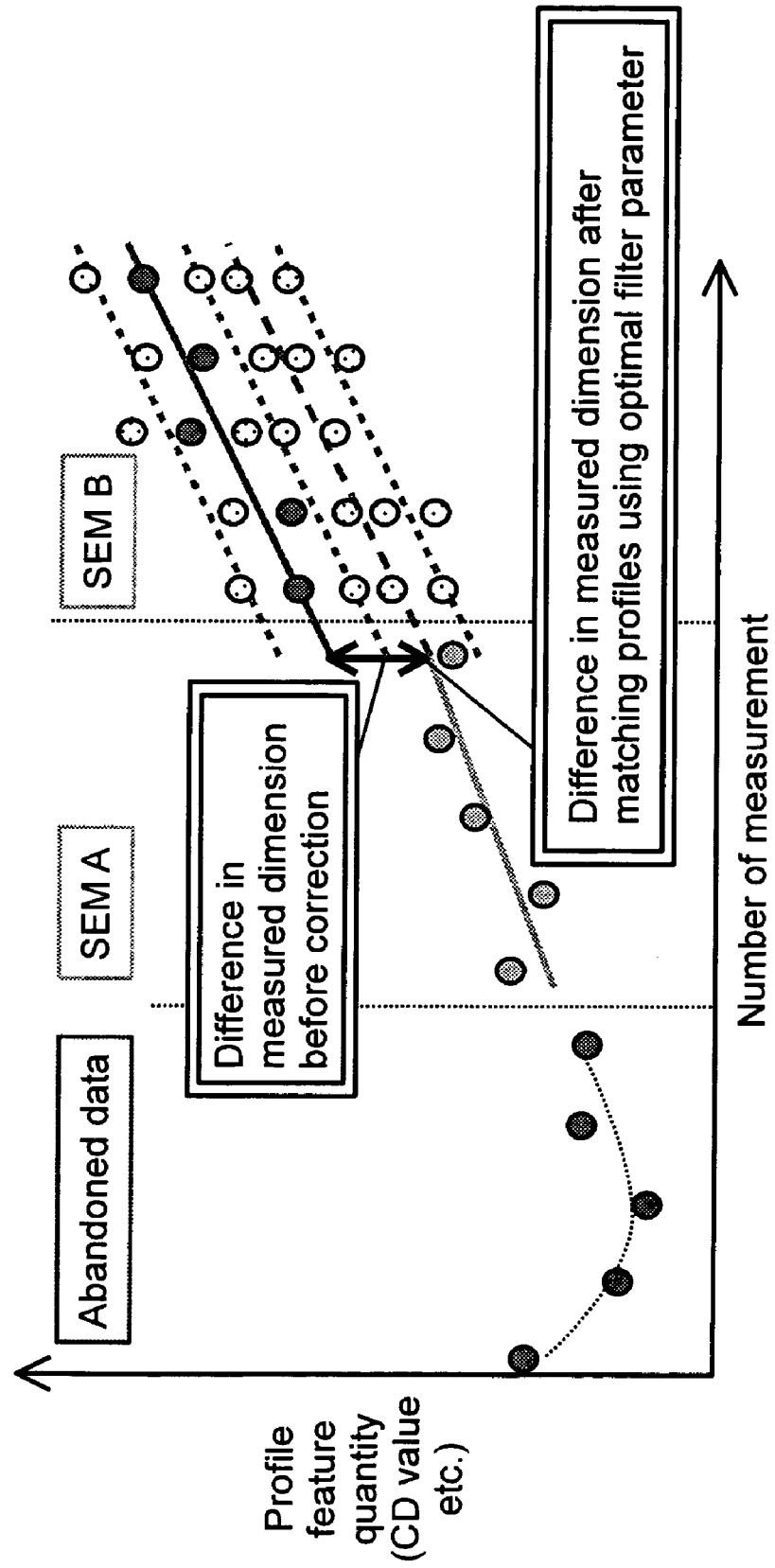
FIG. 14 is a diagram schematically showing calculation processing of a filter parameter used for reducing the difference in a measured dimension between the SEM's according to this invention.

FIG. 14 shows a conceptual diagram of filter parameter search. The filter parameter in the SEM A is set to a fixed value, by which a profile feature quantity is calculated. The filter parameter is varied to an acquired image by the SEM B, and several profile feature quantities are calculated with respective filter parameters. The system searches the filter parameter in the SEM B by which the difference becomes smallest. At this time, in searching a filter parameter by which the difference between the SEM's becomes the smallest, one parameter realizing the minimum may be considered as a search result, or a minimum value may be found by extrapolation using several pieces of data in the vicinity of the above-mentioned minimum value. Finally, the searched filter parameter is designated as an optimal filter parameter by which the difference in a profile feature quantity between the SEM's is reduced and stored in the storage unit 0705 (STEP 1311). By the above, a profile matching operator between the SEM A and the SEM B is calculated. The calculated operator is stored in the storage unit 0112 of each SEM, and can be read out suitably when required.

The above processing is performed similarly for the SEM A and an SEM C and for the SEM A and an SEM D to calculate the profile matching operator. Note that although in this embodiment, the SEM A is designated as a reference and processing in which other SEM's are matched with this is performed, processing of matching can also be done as follows rather than this: the SEM B is designated as a reference after the SEM A was matched with the SEM B, the SEM C is matched with the SEM B serving as a reference, and further the SEM D is matched with the SEM C serving as a reference after the matching of the SEM C.

Figure 15:
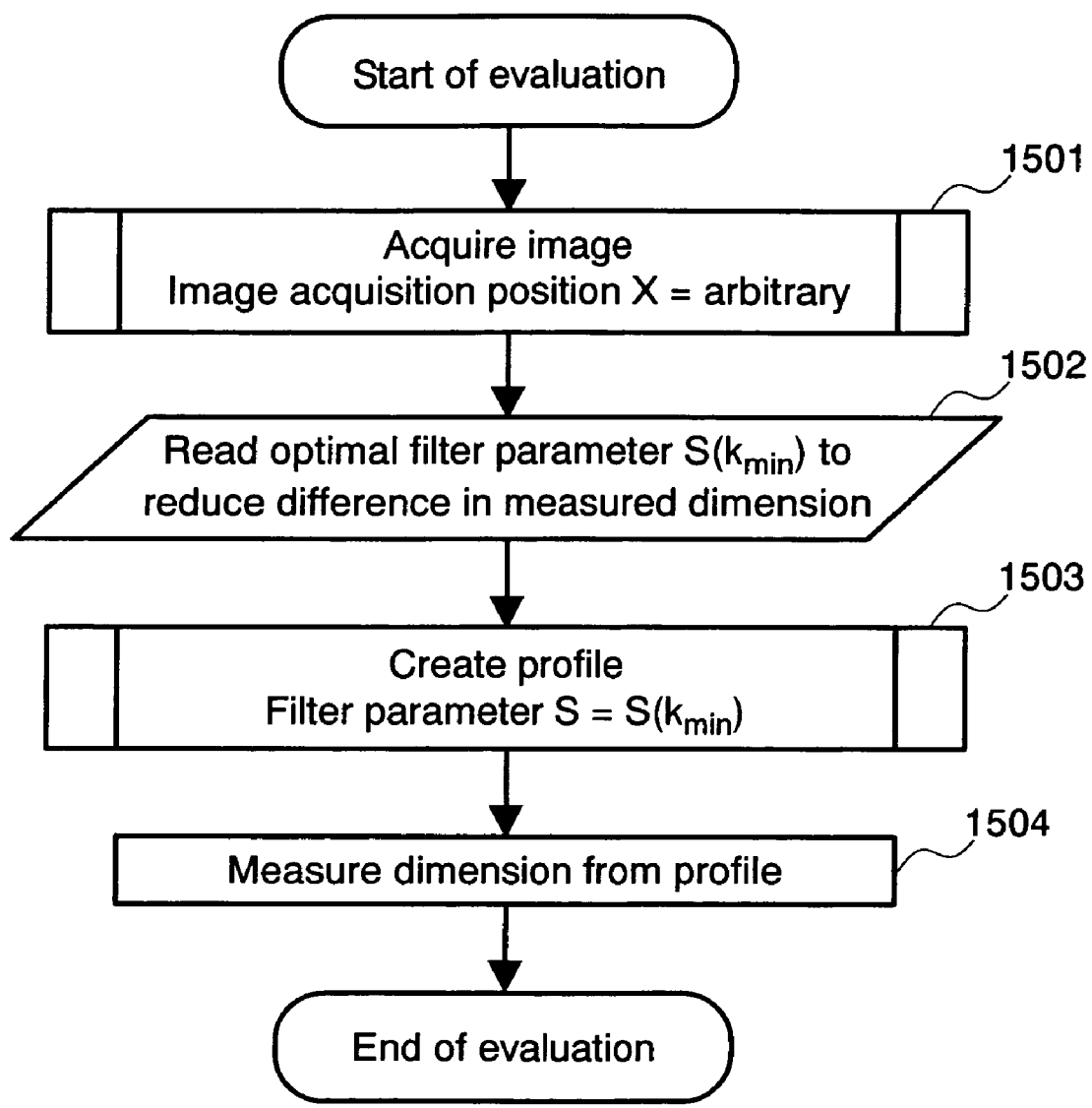
FIG. 15 is a pattern dimension measurement sequence for reducing the difference in a measured dimension between the SEM's according to this invention.

(6) Dimension Measurement Sequence Using Operator for Processing of Profile Matching Between the SEM's Next, a dimension measurement sequence to which the operator being set is applied will be explained according to FIG. 15.

First, an image containing an arbitrary dimensional measurement pattern is acquired (STEP 1501). Next, a filter parameter that is an operator for matching profiles that is set up in this embodiment is read from the storage unit 0112 (STEP 1502). Next, an image profile is created from the image that is acquired using the read filter parameter (STEP 1503). Finally, a dimension is measured from the created image profile (STEP 1504). By the above processing, dimensional measurement with the difference in a measured dimension between the SEM's reduced can be performed.

Figure 10:
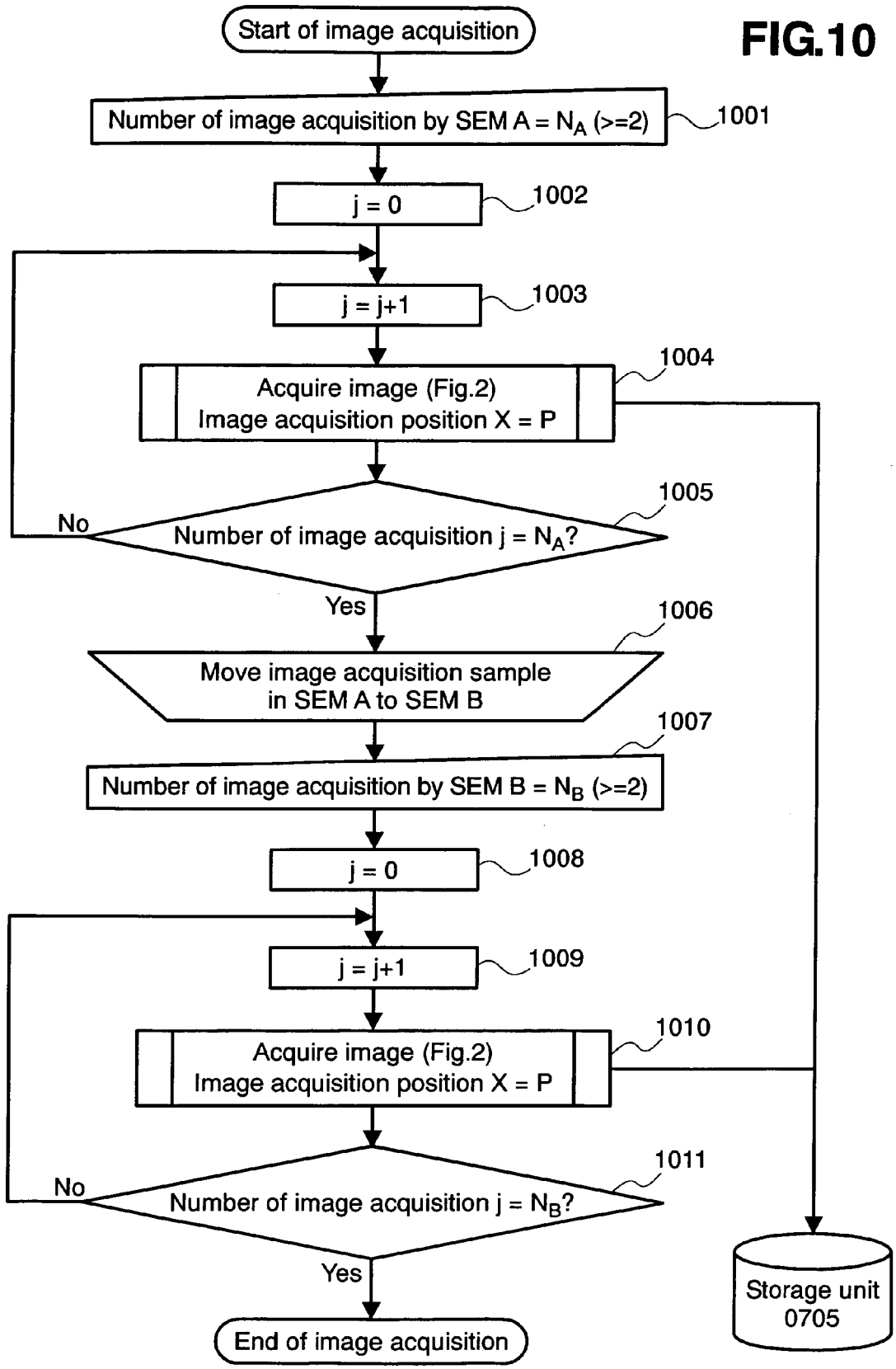
FIG. 10 is an image acquisition sequence necessary to evaluate and reduce the difference in a measured dimension between the SEM's according to this invention.

(7) Supplements and Example of Modified Embodiment (7-1) Evaluation Image Acquisition Sequence A method for acquiring an image necessary for both evaluation of the difference in a profile feature quantity and calculation of an operator for matching profile feature quantities between the SEM's may be such that images of the measurement target pattern at the same position for a plurality of times that are different among the evaluation SEM's are acquired once, respectively, and a mean of the profile feature quantity of the measurement target pattern is calculated for each SEM and designated as a profile feature quantity of that SEM, instead of a method of acquiring an image of the measurement target pattern at the same position for a plurality of times between the evaluation SEM's, which was explained in FIG. 10 previously. In this case, since the profile feature quantity includes a variation of the profile feature quantity of the measurement target pattern itself, it is necessary to choose a sufficient number of measurement target patterns. Moreover, in the method of acquiring an image of the measurement target pattern at the same position for a plurality of times between the evaluation SEM's that was explained previously in FIG. 10, an image acquisition order between the SEM's may be alternate acquisition by the SEM A and the SEM B.

(7-2) Profile Feature Quantity

The profile feature quantity in this invention is a profile shape index-value obtained from image profile information as shown in FIG. 5D, and includes, for example, the above-mentioned pattern dimension 0505, the distance 0506 between profile right and left peaks, the space 0507 between the profile right and left peaks, the width 0508 of the profile peak part, the gradient 0509 of the profile, and in addition to them, the sharpness of the profile etc. Moreover, the profile feature quantity includes the profile itself; a difference in the profile between the SEM's may be evaluated with a normalized correlation value of the profiles.

Among the profile feature quantities used for the evaluation, there are quantities that are subjected to influences of contamination etc. and exhibits increase/decrease depending on the number of measurement, as shown in FIG. 9A. It is preferable to examine a feature quantity having a less increase or decrease in advance and use it.

(7-3) Method for Processing of Profile Matching

Figure 13:
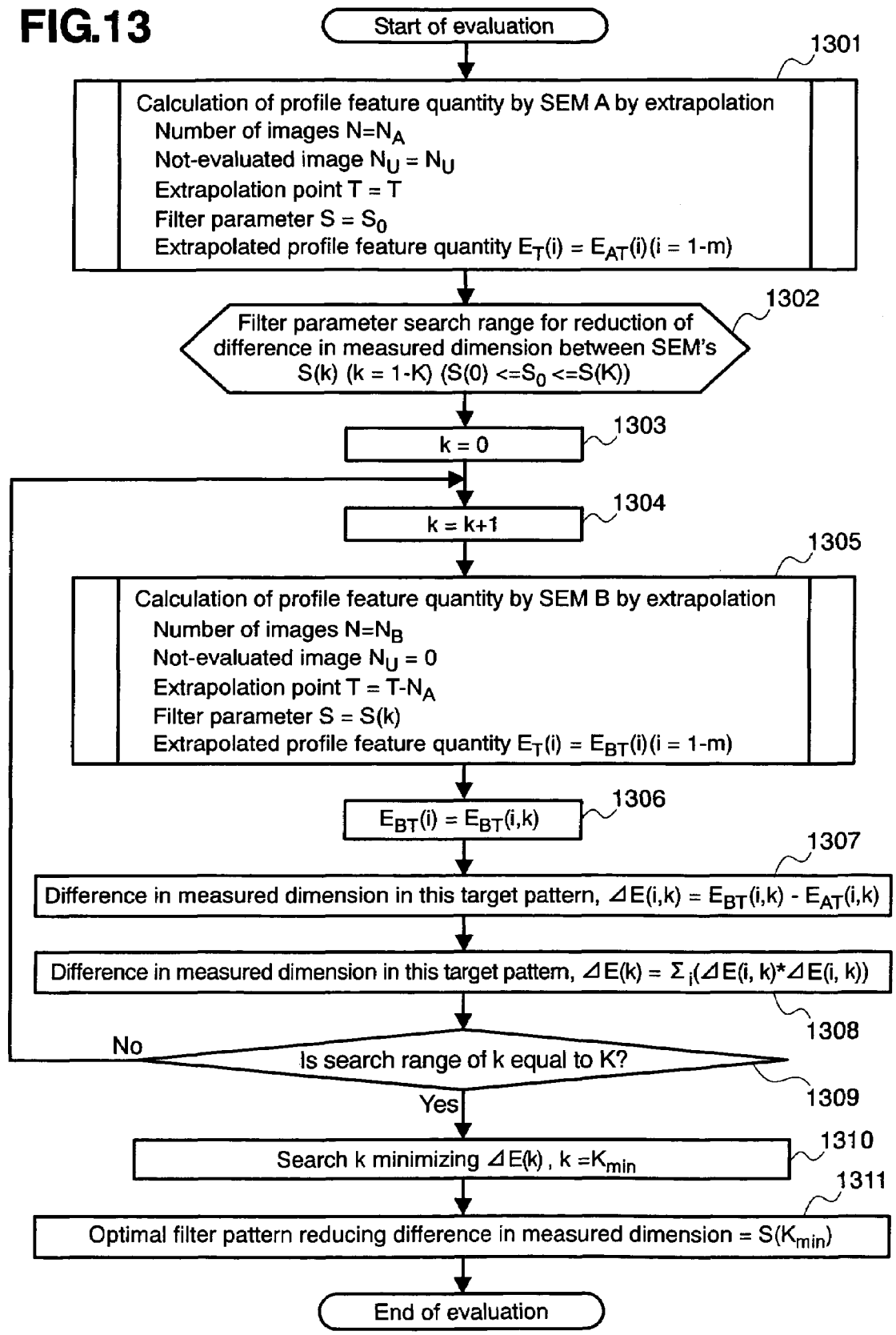
FIG. 13 is a calculation sequence of a filter parameter used for reducing the difference in a measured dimension between the SEM's according to this invention.

In this embodiment, although the processing of profile matching is performed by changing the filter parameter of the filter used in creating an image profile for each SEM, as shown in FIG. 13, other methods that are used in order to match the profiles may be adopted. In this case, what is necessary is to use the appropriate technique instead of application of a filter in this embodiment or to apply the appropriate technique after a filter having a uniform parameter was applied in each SEM.

Alternatively, profile matching may be performed by changing an SEM parameter. In this case, the profiles are being matched with each other by repeating the following processing:

(1) the difference in a measured dimension is correctly measured through a sequence (0801-0802) up to evaluation of the difference in a measured dimension between the SEM's shown in FIG. 8 of this embodiment; and subsequently (2) an SEM parameter of the SEM B is altered. Furthermore, if the profile matching operator finds a necessary amount of adjustment of the SEM parameter necessary to reduce the difference in a measured dimension between the SEM's, this may be fed back to the SEM.

Moreover, a part in which the profile matching is done by the processing of profile matching may be either the whole profile or a part of the profile necessary for dimensional measurement of the pattern. Moreover, a target to which the filter is applied to match the profiles may be a spatial frequency of an image profile or an image itself rather than the image profile created from an image.

(7-4) Kind of Filter

Figure 4:
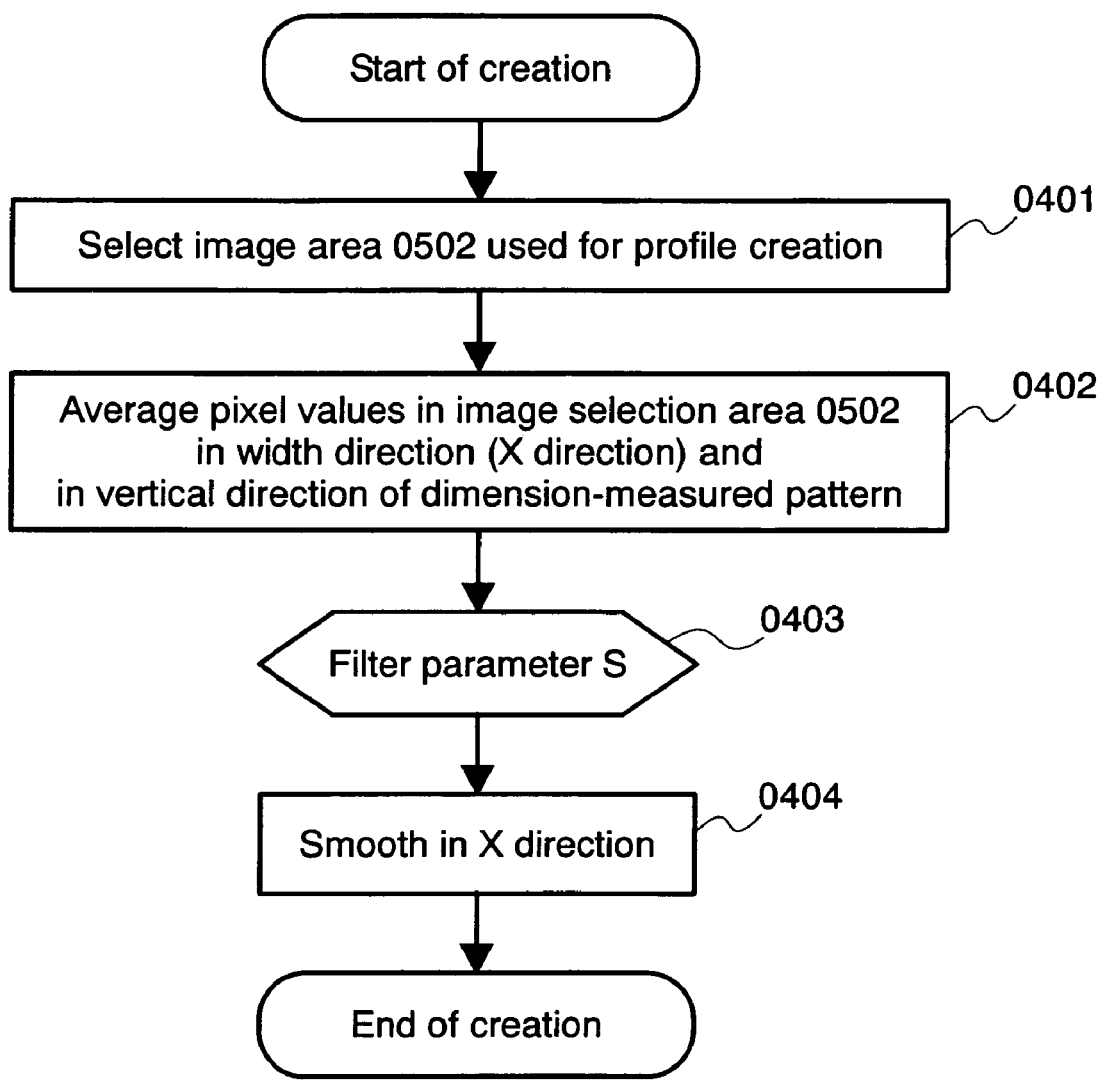
FIG. 4 is a creation sequence of an image profile from an acquired image.
Figure 5:
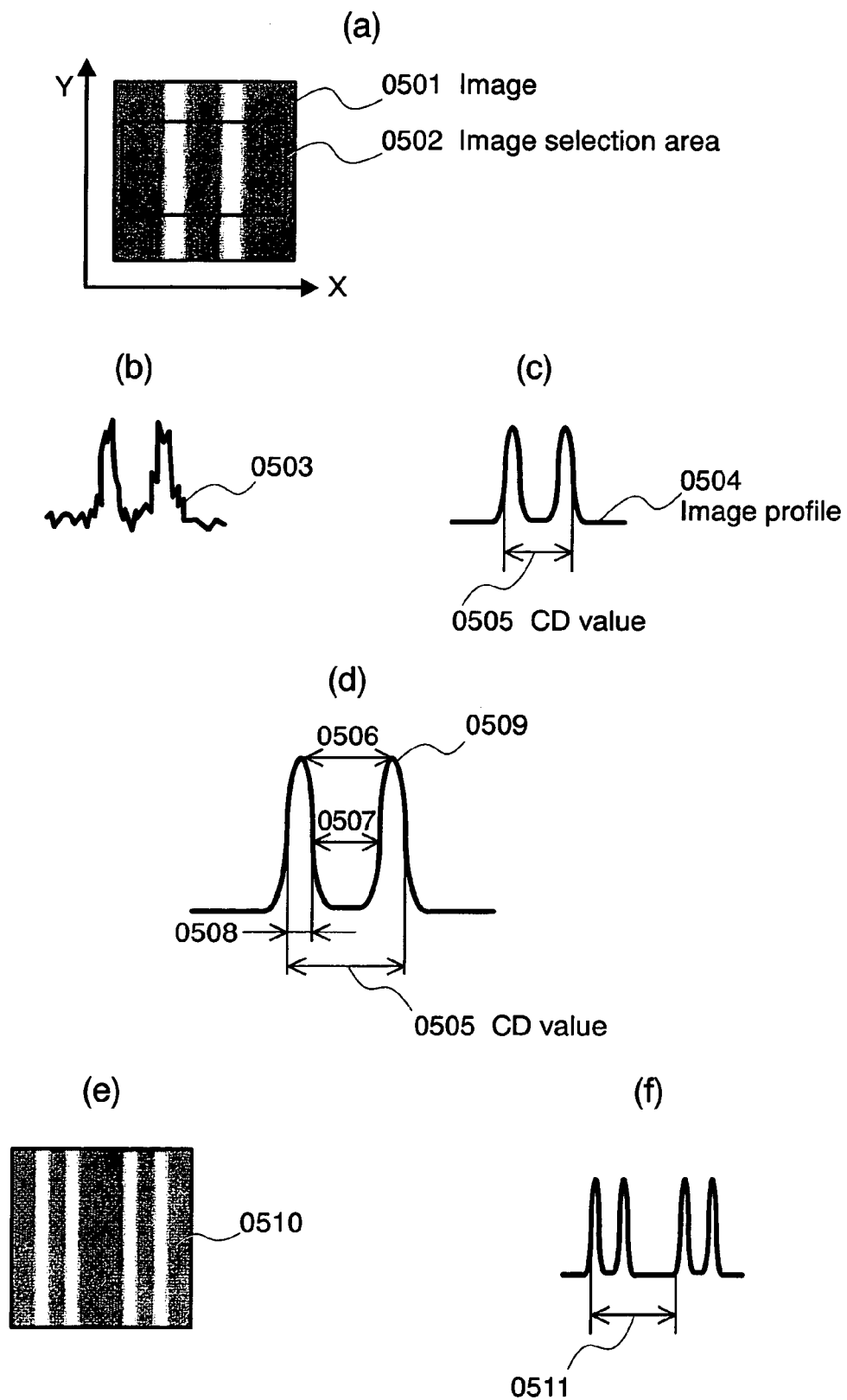
FIG. 5A is a scanning electron microscope image.
FIG. 5B is a one-line waveform in the X-direction of the scanning electron microscope image.
FIG. 5C is an image profile that is smoothed by applying a filter parameter to the one-line waveform.
FIG. 5D is a diagram explaining an index-value obtained from the image profile.
FIG. 5E is a scanning electron microscope image.
FIG. 5F is an image profile whose one-line waveform is smoothed in the X-direction of the scanning electron microscope image.

Although, in this embodiment, a filter used for matching the profiles between the SEM's is specified as a filter for smoothing a profile of FIG. 4, a different filter may be made to produce an effect, separately from the filter for smoothing a profile. In this case, what is necessary is just to add a step in which the profile matching filter is applied before or after the application of the smoothing filter (STEP 0404) in the profile creation sequence in FIG. 4.

Moreover, in accordance with this alteration, what is necessary is to keep the filter parameter for profile smoothing in each SEM constant and replace the filter parameter S in this embodiment with a parameter of the profile matching filter. Furthermore, in this case, no smoothing filter may be applied but only the profile matching filter is being applied to the profile.

In addition, filter calculation may be done by either a convolution filter or a deconvolution filter. Moreover, a kind of the filter may be any one of filters used to match profiles, such as an averaging filter, a sharpening filter, and a blurring filter.

Figure 8:
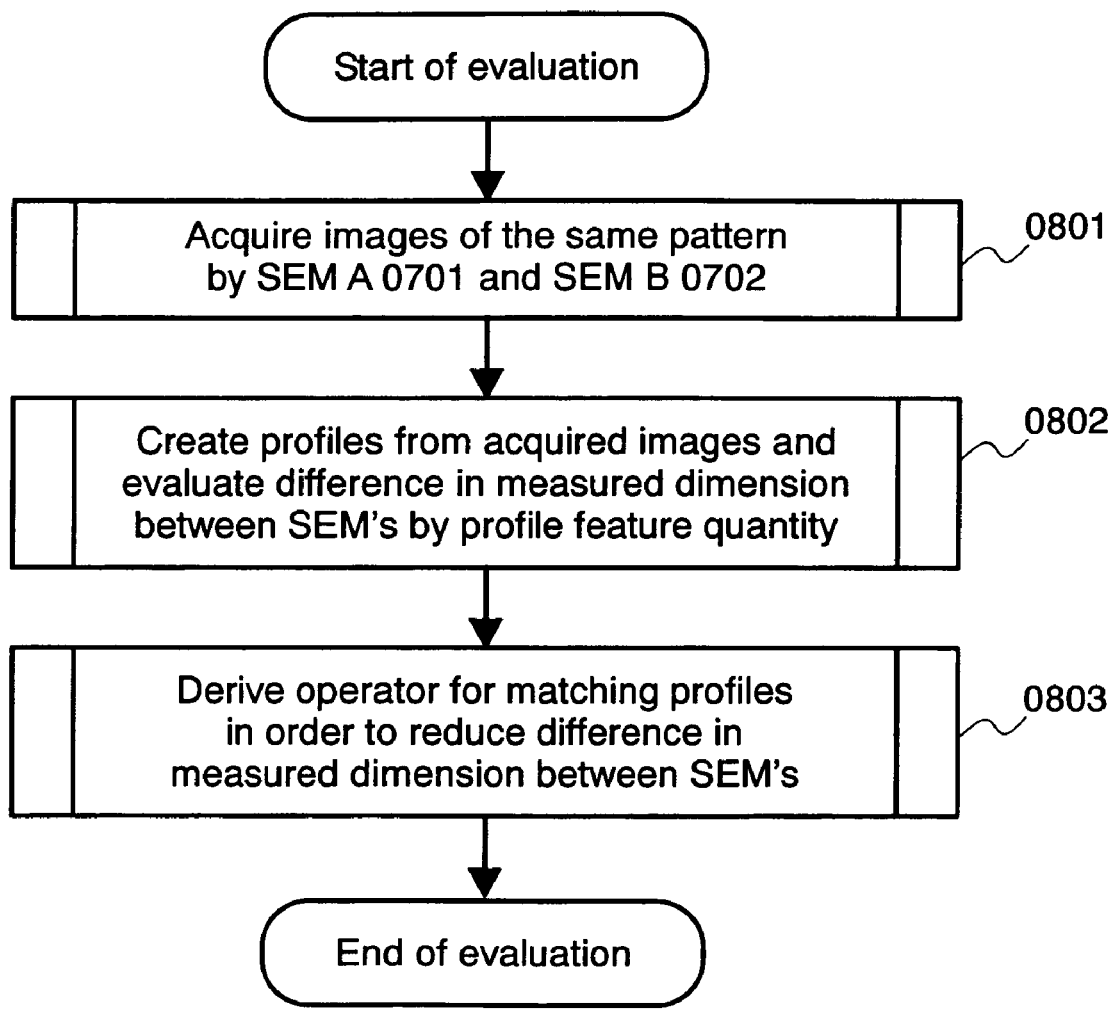
FIG. 8 is a calculation sequence of an operator that reduces a difference in a measured dimension between the SEM's according to this invention.

(7-5) Technique of Reducing the Difference in a Measured Dimension Between the SEM's The difference in a measured dimension between the SEM's may be reduced by the matching in the measured dimension, which is the conventional technique, after the difference in a measured dimension was correctly measured according to the sequence (0801-0802) up to the evaluation of the difference in a measured dimension between the SEM's shown in FIG. 8 of this embodiment.

(7-6) Technique of Matching Dimensional Measurement Magnification Between the SEM's In the case where an image used in evaluating the difference in a measured dimension between the SEM's contains similar patterns, as shown in FIG. 5E, that appear repeatedly in the same image, by measuring a repetition pitch at the same position with each SEM, a ratio of the pitches can be obtained as a comparative magnification error in each SEM. The obtained magnification error between the SEM's can be taken into account at the time of evaluating the difference in a measured dimension between the SEM's. Further, the comparative magnification error among the plurality of SEM's may be reduced by altering the SEM parameter according to this result.

(7-7) Example of Condition Input GUI

Figure 17:
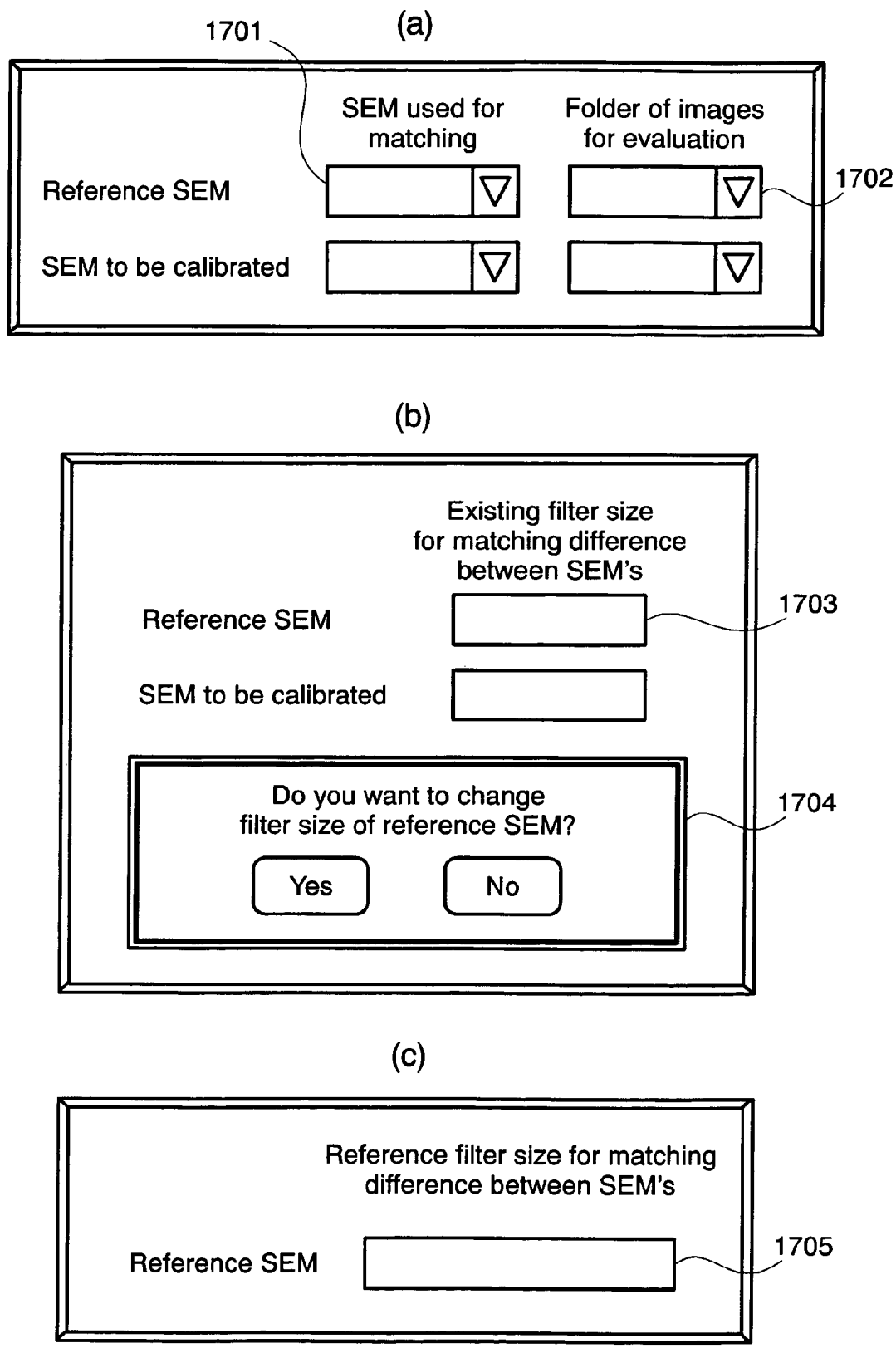
FIG. 17A is a GUI used for designating an SEM serving as a reference for matching, an SEM whose image should be matched with that of the SEM serving as a reference, and a folder of images for evaluation.
FIG. 17B is a GUI showing both information of an existing filter size for matching the difference in a measured dimension and a button through which alteration of the filter size is entered.
FIG. 17C is a GUI through which a filter size that becomes a new reference is entered.

FIG. 17 shows an example of an input GUI for performing the above-mentioned series of processing steps using an image acquired by each SEM. As shown in FIG. 17A, the GUI can have a part 1701 in which the operator enters or selects (designates) an SEM serving as a reference in matching the profiles and an SEM that will be matched with the reference SEM and a part 1702 in which the operator enters or selects an image acquired for profile matching by each SEM.

Moreover, as shown in FIG. 17B, the GUI can display a size of a current filter 1703 for profile matching in each SEM that is designated and a button 174 used to settle alteration of the filter size at the SEM serving as a reference, if necessary. Here, if the filter size is intended to be altered, the GUI can display a part 1705, as shown FIG. 17C, where the operator can enter a filter size in an SEM serving as a new reference.

(7-8) Example of Result Output GUI

FIG. 18 shows an example of an output GUI for outputting a profile feature quantity by each SEM and a difference in a profile feature quantity between the SEM's.

As shown in FIG. 18A, the GUI can display the CD values and the difference in a measured dimension between the SEM's before and after the profile matching by each SEM on the screen and display a button to select whether or not the calculation result of the profile matching operator at this time is adopted in a future dimension measurement sequence on the same screen.

Moreover, as shown in FIG. 18B, the GUI may display a profile matching operator 1803 before the profile matching is done and a newly calculated profile matching operator.

Furthermore, as shown in FIG. 18C, it is possible for the GUI to display the profile feature quantity before the profile feature quantities are matched with each other between the SEM s and the profile feature quantity after the matching was done for each SEM, and to display differences in the profile feature quantity 1804 before and after the matching. Moreover, it can display a root mean square of differences in a profile feature quantity that were calculated in STEP 1308 before and after the matching (1805).

(7-9) Application to Reduction of a Difference in a Measured Dimension Caused by Aging of the SEM In this embodiment, the plurality of SEM's for which a difference in a measured dimension between the SEM's was evaluated were set to mutually different two SEM's. However, the plurality of SEM's thus specified may be the same SEM in different time lines. In this case, an SEM working on Y-th day of the X-th month is the SEM A in this embodiment, and an SEM after Z days from it is the SEM B in this embodiment.

(7-10) Application to Other SEM

This embodiment described scanning electron microscope equipment. Moreover, in other dimension measurement instrument that acquires an image by irradiating an electron beam with another finite size on a sample and measures a dimension using the image and an instrument that acquires an image by irradiating a beam of light on a sample and measures a dimension using the image, it is possible to reduce a difference in a measured dimension between instruments by the same technique.

(7-11) The number of Measurement Patterns Used in Evaluation

In this embodiment, the number of measurement patterns that is used to evaluate a difference in a profile feature quantity between the SEM's and to calculate a profile matching operator may be more than one. Moreover, in order to reduce a dimensional measurement error, a larger number of measurement patterns are preferable. In this case, it is recommended that a mean of profile feature quantities calculated from each pattern is designated as a profile feature quantity of each SEM.

(7-12) Profile Matching Direction

Figure 19:
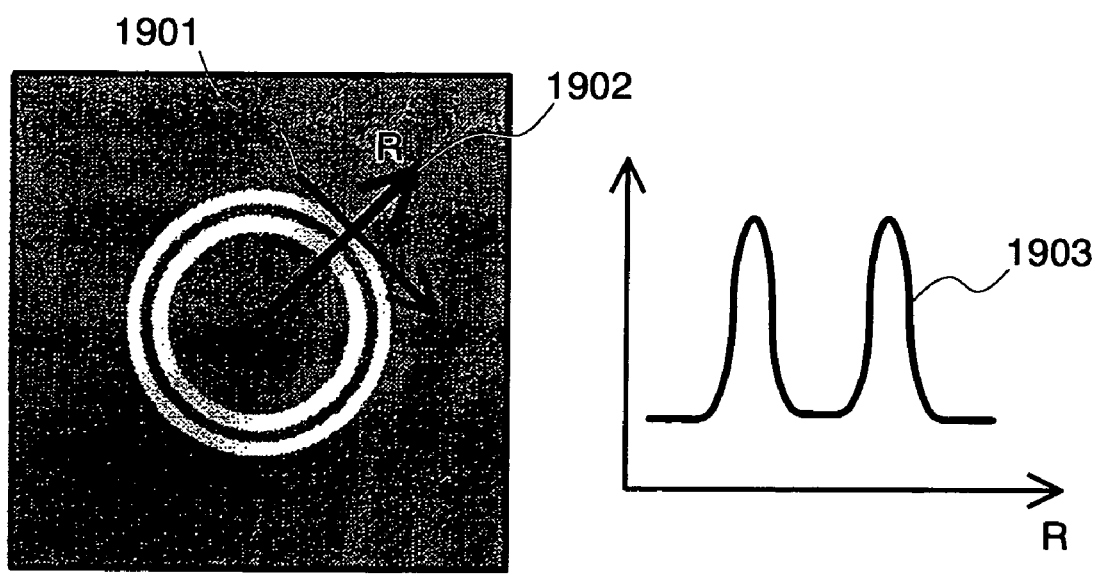
FIG. 19 is a view showing an example of an image for evaluation according to this invention.

In this embodiment, processing in which profiles in the X-direction that was the same as the electron beam scanning direction were matched with each other was explained. In addition to this, it is possible to create a profile in the Y-direction and match the profiles. Further, it may be done to create a profile 1903 in an arbitrary direction 1902 perpendicular to a circumferential direction 1901 from a circular pattern image as shown in FIG. 19, evaluate a difference in a profile feature quantity in each direction, and perform matching.

(7-13) SEM Configuration

In this embodiment, the entire system has a configuration, as shown in FIG. 7, in which each of the plurality of SEM's is connected to the data bus 0708 through the storage unit 0705, the processing unit 0706, and the input/output unit 0707, and performs processing of storing an image acquired by the SEM in the storage unit 0705, while the entire system performs processing of calculating a difference in a measured dimension between the SEM's in the processing unit 0706, calculating a profile matching operator, and subsequently storing the calculated results in the storage unit 0112.

Figure 20:
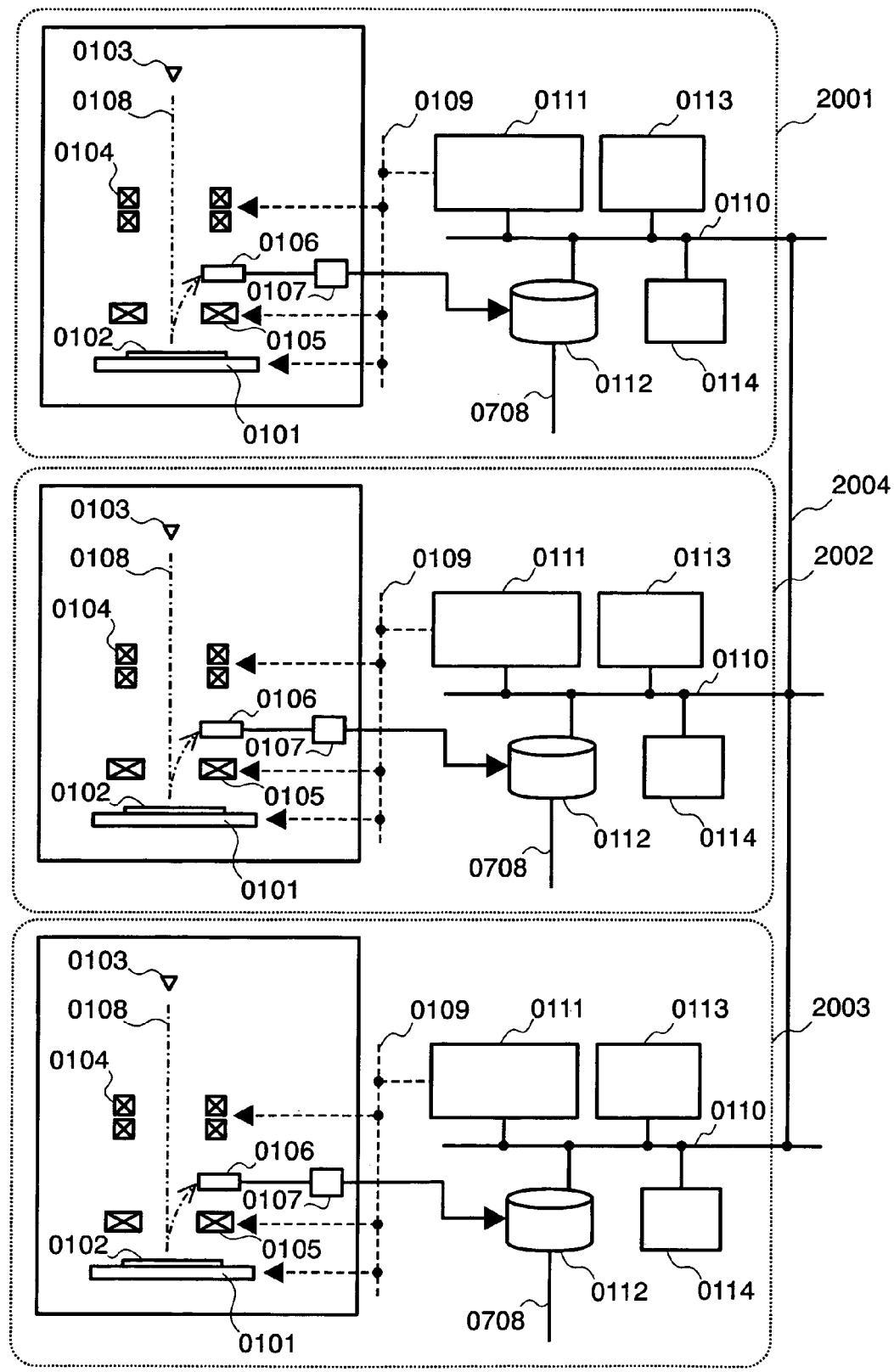
FIG. 20 is a diagram showing an example of a system configuration of scanning electron microscope equipment according to this invention.

As another example of a system configuration rather than the above, the plurality of systems 2001-2003 shown in FIG. 1 may be connected with one another through a data bus 2004. In this case, storage and calculation processing of each image acquired with each SEM described above can be performed in the storage unit 0112 and the processing unit 0113 on any of those on the SEM's. Moreover, instead of the data buses 0708 and 2004 on which data is delivered in the system configuration shown in FIGS. 7 and 20, a storage medium may be used to deliver the data between the SEM's, the storage units, and the processing units.

Moreover, if the aging of the same SEM is evaluated as explained in a paragraph (7.9), the configuration of the system may be substantially the SEM standing alone shown in FIG. 1. At this time, storing the above-mentioned image can be done in the storage unit 0112, and each calculation processing can be done in the processing unit 0113.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method for measuring a dimension of a pattern using a plurality of scanning electron microscopes (SEMs), comprising the steps of:
irradiating and scanning a converged electron beam of a first SEM on a sample on which a pattern is formed;
acquiring an image of the pattern formed on the sample by detecting secondary electrons generated from the sample by the irradiation of the converged electron beam, and creating at least one image profile from the acquired image of the pattern acquired by the first SEM;
reading filter parameter data from a memory, and using the data for adjusting feature quantities of the image profile to match with corresponding feature quantities of at least one image profile of the pattern obtained by using at least one SEM from the plurality of SEMs that is different from the first SEM; and
measuring the dimension of the pattern from the adjusted feature quantities of the image profile.

2. The method for measuring a pattern dimension using a plurality of scanning electron microscopes (SEMs) according to claim 1,
wherein
the filter parameter is selected to produce matching between the feature quantities of the image profiles obtained by using the first SEM and corresponding feature Quantities of the image profile obtained by using the at least one SEM from the plurality of SMS that is different from the first SEM, so that the differences between corresponding feature quantities are minimized.

3. The method for measuring a pattern dimension using a plurality of scanning electron microscopes (SEMs) according to claim 1,
wherein
a filter parameter by which the corresponding feature quantities of the image profile obtained by the first SEM and the image profile obtained by the at least one SEM from the plurality of SMS that is different from the first SEM are matched, is the filter parameter obtained by comparing pieces of information of the image profiles obtained by imaging the same sample pattern for the same number of times using the first SEM and the at least one SEM from the plurality of SMS that is different from the first SEM.

4. The method for measuring a pattern dimension using a plurality of scanning electron microscopes according to claim 1,
further comprising the step of:
reading a magnification correction parameter that is stored in the memory in advance and used to match magnifications between the first SEM and the at least one SEM from the plurality of SMS that is different from the first SEM,
wherein
the magnification correction parameter is a parameter calculated from image profiles obtained by imaging repeated patterns each having the same shape formed on the sample using first SEM and at least one SEM from the plurality of SMS that is different from the first SEM.

5. The method for measuring a pattern dimension using a plurality of scanning electron microscopes (SEMs) according to claim 1,
wherein
the filter parameter by which the corresponding feature quantities of the image profiles are matched is a parameter that considers a difference between a beam shape of the first SEM and a beam shape of the at least one SEM from the plurality of SMS that is different from the first SEM.

6. A method for measuring a dimension of a pattern using a plurality of scanning electron microscopes (SEMs) comprising the steps of:
designating a scanning electron microscope to serve as a reference SEM;
designating a SEM to be calibrated;
calculating a feature quantity of an image profile of a sample pattern, obtained by imaging the sample pattern with the reference SEM;
calculating a feature quantity of an image profile of the sample pattern obtained by imaging the sample pattern with the SEM to be calibrated;
finding a value of a parameter by which the calculated feature quantity of the image profile of the sample pattern obtained by imaging with the reference SEM is matched with the feature quantity of the image profile of the sample pattern obtained by imaging with the SEM to be calibrated;
correcting the sample image obtained by imaging with the SEM to be calibrated, using the parameter value by which the corresponding feature quantities of the images obtained using the reference SEM and the SEM to be calibrated are matched; and
finding the dimension of the sample pattern from the corrected sample image.

7. The method for measuring a pattern dimension using a plurality of scanning electron microscopes (SEMs) according to claim 6,
wherein
finding the value of the parameter is performed by the steps of: calculating the feature quantity of an image profile of the sample pattern after the feature quantity of the image profile of the sample pattern is obtained by imaging the sample pattern two or more times with the reference SEM;
calculating the feature quantity of the image profile of sample pattern after the sample pattern is imaged for a plurality of times using the SEM to be calibrated; and
determining the value of the parameter by which the calculated feature quantity of the image profile of the sample pattern imaged with the SEM to be calibrated is matched with the calculated feature quantity of the image profile of the sample pattern imaged with the reference SEM.

8. A plurality of scanning electron microscopes (SEMs) for measuring a dimension of a pattern,
comprising:
electron beam irradiation means for irradiating and scanning a converged electron beam on a sample on which a pattern is formed;
image acquisition means for acquiring an image of the pattern formed on the sample by detecting secondary electrons emitted from the sample under the impact of the converged electron beam using one SEM;
a memory for storing at least one filter parameter determined by matching corresponding feature quantities of at least one image profile obtained from the image of the pattern using the one SEM with the feature quantities of at least one image profile obtained using at least one other SEM different from the one SEM;

image profile creation means that read the at least one filter parameter stored in the memory and create an image profile from both the at least one read filter parameter and an image of a pattern acquired by the image acquisition means;

pattern dimensional measurement means for measuring a dimension of the pattern from the image profile created by the image profile creation means; and display means for displaying results measured by the pattern dimension measurement means.

9. The scanning electron microscopes (SEMs) according to claim 8, further comprising input means for designating the at least one other SEM.

10. The scanning electron microscopes (SEMs) according to claim 8, further comprising input means for designating a filter parameter by which the feature quantity of the image profile is matched with the at least one other SEM, wherein the one other SEM is a reference SEM.

11. The scanning electron microscopes (SEMs) according to claim 8, wherein the display means display each difference between corresponding feature quantities of the plurality of image profiles obtained from the images acquired using the one SEM and at least one other SEM.

12. An apparatus for correcting a difference among a plurality of scanning electron microscopes (SEMs) for measuring a dimension of a pattern, comprising: designation means for designating both a reference SEM and a SEM to be calibrated using the reference SEM;

first memory for storing a feature quantity of an image profile of a sample pattern obtained by imaging the sample pattern with the reference SEM designated by the designation means, second memory for storing a feature quantity of an image profile of the sample pattern obtained by imaging the sample pattern with the SEM to be calibrated designated by the designation means, parameter calculation means for calculating a parameter to match the corresponding feature quantities of the image profiles of the sample pattern stored in the second memory with the feature quantities of the image profiles of the sample pattern stored in the first memory;

image correction means for correcting an image of a specimen obtained by imaging with the SEM to be calibrated using the parameter for matching calculated by the parameter calculation means; and dimension measurement means for determining a dimension of the pattern on the specimen from the image of the specimen corrected by the image correction means.

13. An apparatus for correcting a difference between scanning electron microscopes (SEMs) according to claim 12, wherein the sample pattern is imaged for a plurality of times with the reference SEM, a parameter calculation means that calculate a parameter that comprises a prediction of a variation of the feature quantity of the image profile of the sample pattern caused by a deformation of the sample pattern induced by a plurality of electron beam irradiations from the reference SEM, and a parameter by which the feature quantity of the image profile of the sample pattern of the reference SEM is matched with the feature quantity of the image profile of the sample pattern of the SEM to be calibrated.

* * * * *